United States Patent [19]
Kobayashi

[11] Patent Number: 5,621,226
[45] Date of Patent: Apr. 15, 1997

[54] METAL-INSULATOR SEMICONDUCTOR GATE CONTROLLED THYRISTOR

[75] Inventor: Hideo Kobayashi, Hitachi, Japan

[73] Assignee: Hitachi, Ltd., Tokyo, Japan

[21] Appl. No.: 233,744

[22] Filed: Apr. 26, 1994

[30] Foreign Application Priority Data

Apr. 27, 1993 [JP] Japan ................................ 5-100712
Dec. 3, 1993 [JP] Japan ................................ 5-304119

[51] Int. Cl.⁶ .......................... H01L 29/74; H01L 31/141
[52] U.S. Cl. .......................... 257/140; 257/133; 257/146; 257/147; 257/168; 257/172
[58] Field of Search .................................. 257/140, 133, 257/139, 146, 147, 168, 172, 129

[56] References Cited

U.S. PATENT DOCUMENTS

| | | | |
|---|---|---|---|
| 4,847,671 | 6/1989 | Pattanayak et al. ................ | 257/139 |
| 4,958,211 | 9/1990 | Temple .................................. | 257/139 |

FOREIGN PATENT DOCUMENTS

| | | | |
|---|---|---|---|
| 0340445 | 4/1988 | European Pat. Off. ............... | 257/147 |
| 4025122 | 8/1990 | Germany .............................. | 257/147 |
| 57-206279 | 12/1982 | Japan .................................... | 257/147 |
| 5029607 | 2/1993 | Japan .................................... | 257/147 |
| 2204995 | 5/1988 | United Kingdom .................. | 257/147 |
| 2267996 | 5/1993 | United Kingdom .................. | 257/146 |

*Primary Examiner*—Steven H. Loke
*Attorney, Agent, or Firm*—Antonelli, Terry, Stout & Kraus, LLP

[57] ABSTRACT

In a complex semiconductor device, an IGBT and a thyristor are formed in an identical semiconductor substrate to be connected in parallel with each other between main electrodes such that an end of the thyristor on the cathode side is connected to the main electrode via an insulated gate electrode of the IGBT. Thanks to the complex of the IGBT and the thyristor, there is attained a semiconductor device having a satisfactory ignition characteristic, a low on-state voltage, and a high breakdown voltage.

14 Claims, 22 Drawing Sheets

C-C CROSS SECTION

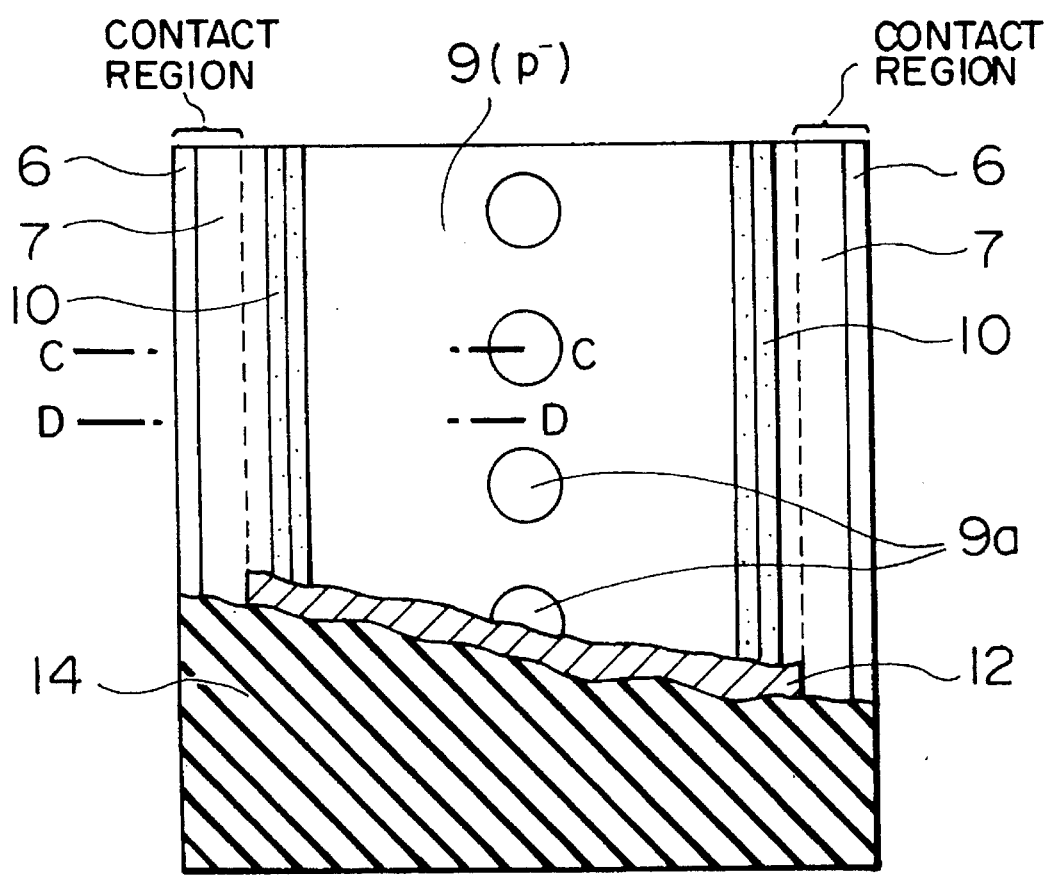

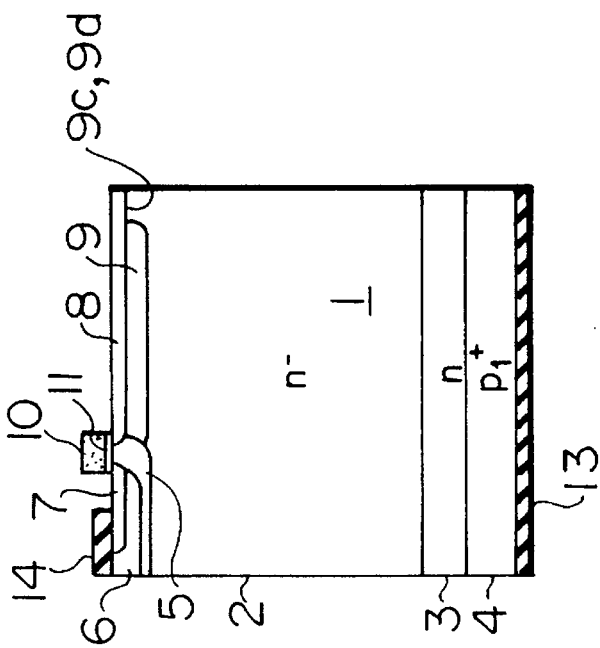
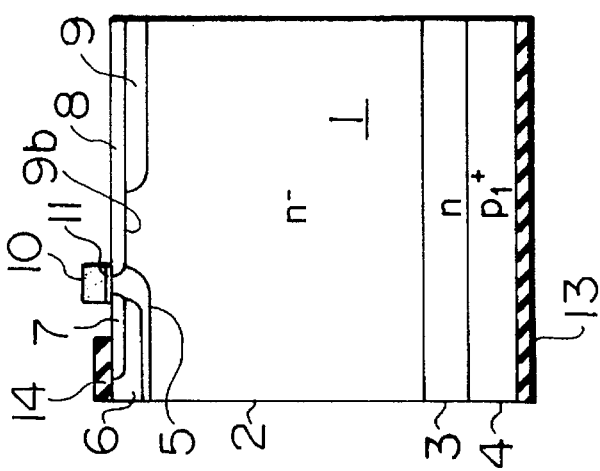
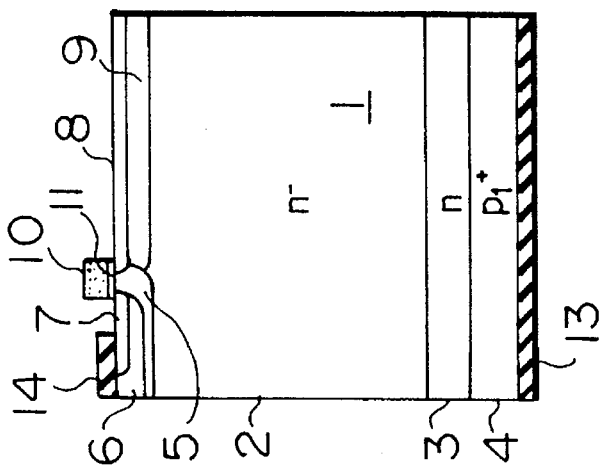

METAL-INSULATOR SEMICONDUCTOR GATE CONTROLLED THYRISTOR

BACKGROUND OF THE INVENTION

The present invention relates to a semiconductor device capable to being turned on and off by an insulated gate electrode, and, in particular, to a complex semiconductor device having a reduced resistance loss in the on state and being particularly suitable for developing a high breakdown voltage or allowing a large current.

Due to requirements of high performance of power transducers included in inverter systems, it has been desired to develop a high-speed semiconductor switching device attended with a reduced loss. Recently, as a semiconductor device satisfying such a requirement, an insulated gate bipolar transistor (IGBT) has attracted attention. The IGBT has, when compared with a metal insulator semiconductor field effect transistor (MISFET), features of a decreased on-state voltage. Moreover, as compared with devices of a current control type such as a GTO thyristor, the IGBT has certain important advantages. For example, it has a higher operation speed and its gate circuit is simple and can be implemented in a compact structure. Consequently, centered on an inverter of a relatively small capacity, the application range thereof is expanding.

Such an IGBT has been described, for example, in pages 220 to 225 of the Proceedings of 1991 International Symposium on Power Semiconductor Devices & ICs, Tokyo. FIG. 26 shows a schematic cross-sectional configuration of such an IGBT. In the diagram, numeral 400 indicates an $n^-$-type layer adjacent to a principal surface 411, numeral 401 denotes an $n^-$-type layer which is adjacent to the $n^-$-type layer 400 and which has an impurity concentration higher than that of the layer 400, numeral 402 designates a $p^+$-type layer adjacent to the $n^-$-type layer 401 and a principal surface 412, numeral 403 stands for a p-type layer which extends from the principal surface 411 into the $n^-$-type layer 400 and which has an impurity concentration higher than that of the layer 400, numeral 404 indicates an $n^+$-type layer which extends from the principal surface 411 into the p-type layer 403 and which has an impurity concentration higher than that of the layer 403, numeral 405 denotes a cathode electrode which is brought into contact with the $n^+$-type layer 404 and the p-type 403 in the principal surface 411, a numeral 406 designates an anode electrode being brought into contact with the $p^+$-type layer 402 in the principal surface 412, and numeral 407 stands for an insulated gate electrode formed via an insulation layer 408 at least on the p-type layer 403 on the principal surface 411. The semiconductor device includes a pnp transistor ($Q_1$) including the $p^+$-type layer 402, the $n^-$-type layer 400, and the p-type layer 403; an npn transistor ($Q_2$) including the $n^-$-type layer 400, the p-type layer 403, and the $n^+$-type layer 404; and an n-channel MISFET ($M_1$) including the insulated gate electrode 407, the $n^+$-type layer 404, the p-type layer 403, and the $n^-$-type layer 400. Ordinarily, since the p-type layer 403 is designed to have a sufficiently small lateral resistance r, the npn transistor ($Q_2$) does not have the opportunity to operate. Namely, the semiconductor above can be regarded as a complex of an MISFET and a pnp transistor. FIG. 27 shows an equivalent circuit of the semiconductor device of FIG. 26. Next, the operation principle will be described by reference to FIGS. 26 and 27.

First, to turn the semiconductor device on, a negative potential and a positive potential are applied respectively to the cathode electrode 405 and the anode electrode 406 such that the insulated gate electrode 407 is applied with a potential which is larger in terms of positive potential than that of the cathode electrode 405. Resultantly, on the surface of the p-type layer 403 below the insulated gate electrode 407, there is formed an inversion layer (channel) such that a short circuit is established between the $n^+$-type layer 404 and the $n^-$-type layer 400 to turn the n-channel MISFET ($M_1$) on. As a result, electrons (MIS current) injected from the cathode electrode 405 via the MISFET ($M_1$) pass through the $n^-$-type layer 400 to flow into the $p^+$-type layer 402, thereby injecting holes from the $p^+$-type layer 402 into the $n^-$-type layer 400. The carriers are consequently accumulated to cause a conductivity modulation in the $n^-$-type layer 400 so as to lower the resistance R of the $n^-$-type layer 400, which sets the semiconductor device to the on state. Since the lateral resistance r of the p-type layer 403 is designed to be sufficiently small, a parasitic thyristor including the $n^+$-type layer 404, the p-type layer 403, the $n^-$-type layer 400, and the $p^+$-type layer 402 (including $Q_1$ and $Q_2$) cannot be easily operated.

On the other hand, to turn the semiconductor device off, the potential of the insulated gate electrode 407 is set to be equal to or lower than that of the cathode electrode 405 to extinguish the inversion layer on the surface of the p-type layer 403 below the electrode 407 such that injection of electrons from the $n^+$-type layer 404 is interrupted. Resultantly, injection of holes from the $p^+$-type layer 402 is also stopped to set the semiconductor device to the off state.

In the IGBT above, since conductivity modulation occurs in the $n^-$-type layer 400 due to injection of holes from the $p^+$-type layer 402, there can be characteristically developed an on-state voltage lower than that of the MISFET. Furthermore, since electrons from the $n^+$-type layer 404 serving as an emitter of the bipolar transistor are instantaneously injected or interrupted by the gate potential, a switching operation having a speed as high the speed of a MISFET can be carried out.

In addition, there has been recently proposed a new-type semiconductor device in which a thyristor is controlled by an insulated gate electrode. Such a device has been discussed, for example, in pages 256 to 260 of the Proceedings of 1992 International Symposium on Power Semiconductor Devices & ICs, Tokyo. FIG. 29 shows a semiconductor device described in conjunction with FIG. 1 of the above article. The device includes an $n^-$-type layer 500 adjacent to a principal surface 511, an n-type layer 501 which is adjacent to the $n^-$-type layer 500 and which has an impurity concentration higher than that of the $n^-$-type layer 500, a $p_1^+$-type layer 502 which is adjacent to the n-type layer 501 and a principal surface 512 and which has an impurity concentration higher than that of the n-type layer 501, a $p_2^+$-type layer 503 which extends from the principal surface 511 into the $n^-$-type layer 500 and which has an impurity concentration higher than that of the $n^-$-type layer 500, a $p^-$-type layer 504 which is adjacent to the $p_2^+$-type layer 503, which extends from the principal surface 511 into the $n^-$-type layer 500, and which has an impurity concentration between those respectively of the $n^-$-type layer 500 and the $p_2^+$-type layer 503, an $n_1^+$-type layer 505 which extends from the principal surface 511 into the $p_2^+$-type layer 503 and the $p^-$-type layer 504 and which has an impurity concentration higher than that of the $p_2^+$-type layer 503, an $n_2^+$-type layer 506 which extends at a position apart from the $n_1^+$-type layer 505 from the principal surface 511 into the $p^-$-type layer 504 and which has an impurity concentration higher than that of the $p^-$-type layer 504, a cathode electrode 509 being brought into contact with the $n_1^+$-type layer 505 and the $p_2^+$-type layer 503, an anode electrode 510 being brought into contact with the $p_1^+$-type layer 502, a first insulated gate electrode $G_1$ formed via an insulation layer on an exposed surface of the $p^-$-type layer 504 exposed between the $n_1^+$-type layer 505 and the $n_2^+$-type layer 506, and a second insulated gate electrode $G_2$ formed via an insulation layer on an exposed surface of the $p^-$-type layer 504 exposed between the $n^-$-type layer 500 and the $n_2^+$-type layer 506. The semiconductor device has therein a thyristor including a pnp transistor ($Q_1$) including the $p_1^+$-type layer 502, the $n^-$-type layer 500, and the $p^-$-type layer 504 and an npn transistor ($Q_2$) including the $n^-$-type layer 500, the $p^-$-type layer 504, and the $n_2^+$-type layer 506. Moreover, the device has an n-channel MISFET ($M_1$) including the first insulated gate electrode $G_1$, the $n_1^+$-type layer 505, the $p^-$-type layer 504, and the $n_2^+$-type layer 506 and an n-channel MISFET ($M_2$) including the second insulated gate electrode $G_2$, the $n_2^+$-type layer 506, the $p^-$-type layer 504, and the $n^-$-type layer 500. In addition, as a parasitic element, there is included a parasitic thyristor including the $n_1^+$-type layer 505, the $p_2^+$-type layer 503, the $n^-$-type layer 500, and $p_1^+$-type layer 502.

FIG. 30 shows an equivalent circuit of the semiconductor device of FIG. 29. The operation principle will be next described by reference to FIGS. 29 and 30. First, to turn the semiconductor device on, a negative potential and a positive potential are applied respectively to the cathode electrode 509 and the anode electrode 510 such that each of the first and second insulated gate electrodes $G_1$ and $G_2$ is applied with a potential larger in terms of positive potential than that of the cathode electrode 509. Resultantly, an inversion layer is formed in the surface of the $p^-$-type layer 504 below the first and second insulated gate electrodes $G_1$ and $G_2$ such that a short circuit is formed between the $n_1^+$-type layer 505, $n_2^+$-type layer 506, and the $n^-$-type layer 500, thereby turning the n-channel MISFETs ($M_1$ and $M_2$). As a result, electrons (MIS current) injected from the cathode electrode 509 via the n-channel MISFETs ($M_1$ and $M_2$) pass the $n^-$-type layer 500 to flow into the $p_1^+$-type layer 502, and then holes are injected from the $p_1^+$-type layer 502 into the $n^-$-type layer 500. When the hole current reaches the $p^-$-type layer 504 and flows into the cathode electrode 509, a potential difference appears due to a lateral resistance $r_2$ of the $p^-$-type layer 504. When the potential difference exceeds a diffusion potential between the $p^-$-type layer 504 and the $n_2^+$-type layer 506 (about 0.7 V for silicon at the room temperature), electrons are directly injected from the $n_2^+$-type layer 506 into the $n^-$-type layer 500 and hence the thyristor is ignited and the semiconductor device is set to the on state. In this connection, the resistor $r_1$ is sufficiently small due to the high impurity concentration of the $p_2^+$-type layer 503. Consequently, the parasitic thyristor including $Q_3$ and $Q_4$ cannot be easily turned on.

On the other hand, to turn the device off, the potential of the first and second insulated gate electrodes $G_1$ and $G_2$ is set to be equal to or less than that of the cathode electrode 509 such that the inversion layer in the surface of the $p^-$-type layer 504 below the first and second insulated gate electrodes $G_1$ and $G_2$ is extinguished to interrupt injection of electrons from the $n_2^+$-type layer 506. This resultantly interrupts injection of holes from the $p_1^+$-type layer and hence the semiconductor is set to the off state.

The semiconductor device of this type has the following feature. Namely, thanks to the thyristor operation, electrons supplied from the cathode electrode 509 via the n-channel MISFET ($M_1$) flow in a state where the electrons are extended in the lateral direction of the $n_2^+$-type layer 506 and, hence, the on-state voltage (resistance loss) in the conductive state can be minimized as compared with the conventional IGBT. In addition, the device can be turned on and off respectively according to application and removal of the potential onto and from the insulated gate electrode. This leads to a feature that the gate circuit is quite simplified, similar to the case of the conventional IGBT.

Although they have increased in popularity, IGBTs suffer from certain problems. For example, due to the difficulty of obtaining a high breakdown voltage and a large current, IGBTs cannot be easily applied to an inverter having a large capacity. FIG. 28 shows simulation results of lines of current flow on the cathode side in the stationary on state of the IGBT. Electrons flowing from the cathode electrode 405 via the inversion layer (n channel) to the $n^-$-type layer 400 are slightly extended in the lateral direction by an $n^+$-type accumulation layer formed in the surface of the $n^-$-type layer 400 just below the gate electrode 407. However, according to influence from the large resistance of the $n^+$-type accumulation layer, the electrons cannot be fully extended. In consequence, in a position apart from the cathode electrode 405 (below the right insulated gate electrode in FIG. 26), the current does not easily blow and, hence, the on-state voltage becomes larger. On the other hand, in a region below the p-type layer 403, due to depletion caused by a potential drop in the $n^-$-type layer 400, the current does not easily flow. This phenomenon is more remarkable when the impurity concentration of the $n^-$-type layer 400 becomes lower to attain a higher breakdown voltage. Namely, for a higher breakdown voltage, the gate length is required to be elongated, which in turn results in deterioration of extension of the current flow in the lateral direction. In other words, the electron supply from the cathode side is decreased and the conductivity modulation effect is reduced. Consequently, when the breakdown voltage of the IGBT is increased, the on-state voltage becomes considerably higher, which leads to a problem of difficulty in increasing the capacity.

Moreover, the thyristor of the MIS gate type above is attended with a problem that the thyristor cannot be easily ignited. In the conventional device, as described above, when the device is turned on, an inversion layer is first formed in the surface of the $p^-$-type layer 504 below the insulated gate electrodes $G_1$ and $G_2$ and then the n-channel MISFETs ($M_1$ and $M_2$) are turned on to form a short circuit between the $n_1^+$-type layer 505, the $n_2^+$-type layer 506, and the $n^-$-type layer 500. Resultantly, as can be seen from the equivalent circuit of FIG. 30, electrons (MIS current) injected from the cathode electrode 509 into the $n^-$-type layer 500 are required to pass the inversion layers (channels) of the two MISFETs $M_1$ and $M_2$, and, hence, the electron current is limited due to the channel resistance. In consequence, since the hole current from the $p_1^+$-type layer 502 is small, the thyristor is not easily ignited. To prevent this phenomenon, there may be employed a method of increasing the area (channel width) of $M_2$ or decreasing the area of the $n_2^+$-type layer 506. This, however, means that the area of the thyristor through which the main current is passed is minimized in the overall semiconductor device. Consequently, the resistance loss (on-state voltage) in the conductive state is increased, which leads to a problem similar to that of the conventional IGBT.

Moreover, in the the MIS gate-type thyristor, the $p^-$-type layer 504 is connected via the $p^+$-type layer 503 to the cathode electrode; consequently, it is difficult to ignite the thyristor. Namely, the voltage drop caused by the lateral resistance $r_2$ of the $p^-$-type layer occurs particularly in the vicinity of the cathode electrode and is hence small. In consequence, the thyristor is not ignited in the region. As a result, there arises a problem that only a portion of the thyristor is ignited, and, hence, the on-state voltage is increased.

SUMMARY OF THE INVENTION

It is therefore an object of the present invention to provide a complex semiconductor device having an insulated gate electrode developing a small resistance loss (on-state voltage) in the conductive state while still being suitable for a high breakdown voltage, thereby removing the drawbacks of the prior art.

Other objects of the present invention will be understood from the following description of embodiments according to the present invention.

In order to achieve the objects, a complex semiconductor device according to the present invention has a structural aspect in which an IGBT region and a thyristor region are arranged in a semiconductor substrate to be adjacent to each other and a pair of main electrodes are disposed on two principal surfaces of the substrate. The IGBT region is directly connected to the paired main electrodes. An end region of a cathode side of the thyristor region is linked via an MISFET region existing in the IGBT region to the main electrode on the cathode side. An end region on an anode side is directly connected to the main electrode on the anode side.

Specifically, the complex semiconductor device according to the present invention includes a semiconductor substrate including a pair of principal surfaces, a first semiconductor layer of a first conduction type, a second semiconductor layer of a second conduction type being adjacent to the first primary surface and the first semiconductor layer and having an impurity concentration higher than that of the first semiconductor layer, a third semiconductor layer of the second conduction type extending from a second principal surface into the first semiconductor layer and having an impurity concentration higher than that of the first semiconductor layer, a fourth semiconductor layer of the first conduction type extending from the second principal surface into the third semiconductor layer and having an impurity concentration higher than that of the third semiconductor layer, a fifth semiconductor layer of the first conduction type extending from the second principal surface into the first semiconductor layer, being partially brought into contact with the third semiconductor layer, being apart from the fourth semiconductor layer, and having an impurity concentration higher than that of the third semiconductor layer, and a sixth semiconductor layer of the second conduction type being disposed between the first and fifth semiconductor layers, being apart from the third semiconductor layer, and having an impurity concentration between those respectively of the first and fifth semiconductor layers; a first main electrode being brought into contact via a low resistance with the second semiconductor layer in the first principal surface of the semiconductor substrate; a second main electrode being brought into contact via a low resistance with the third and fourth semiconductor layers in the second principal surface of the semiconductor substrate; and a control electrode formed via an insulation layer on a surface of the third semiconductor layer exposed between the fourth and fifth semiconductor layers in the second principal surface of the semiconductor substrate between.

Other aspects of the present invention will be understood from the following description of embodiments according to the present invention.

In the complex semiconductor of the present invention, since the thyristor region is attached to the IGBT region in a favorable complex form, electrons supplied from the cathode electrode via an MIS channel to the thyristor region will flow in a sufficiently extended state without deteriorating the ignition characteristic of the thyristor, thereby fully minimizing the on-state voltage. Namely, a p-type base layer of the IGBT region and a p-type base layer of the thyristor region are separatedly disposed such that an n-type emitter layer of the thyristor region is partially brought into contact with the n-type base layer. This allows an MISFET existing in the IGBT region to control the IGBT current and the thyristor current. That is, the MIS current necessary to ignite the thyristor region passes only one channel resistance of the MISFET and hence the thyristor can be easily ignited by a small IGBT (or MIS) region. Moreover, for the thyristor region, since only one channel resistance of the MISFET is intervened, it is possible to obtain a sufficiently low on-state voltage.

BRIEF DESCRIPTION OF THE DRAWINGS

These and other objects and advantages of the present invention will become apparent by reference to the following description and accompanying drawings wherein:

FIG. 19 is a schematic plan view showing a fourth configuration example formed by altering the configuration and the arranging position of the notched portions of the p-type layer in the embodiment of FIGS. 12A and 12B;

FIGS. 20A to 20C are schematic cross-sectional views of A—A, B—B, C—C, D—D, and E—E line portions in the respective configuration examples shown in FIGS. 17 to 19;

DESCRIPTION OF THE PREFERRED EMBODIMENTS

Figure 1:
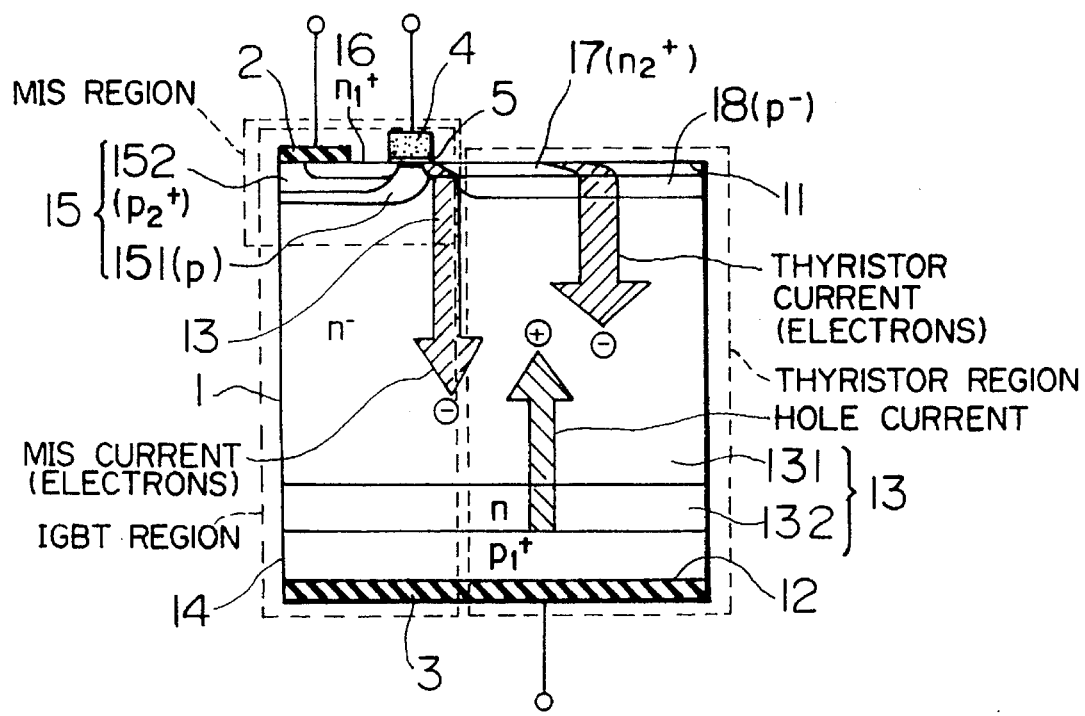
FIG. 1 is a schematic cross-sectional view showing an embodiment of a complex semiconductor device according to the present invention.

Referring now to the drawings, description will be given of embodiments according to the present invention.

FIG. 1 is a schematic cross-sectional view showing an embodiment of a complex semiconductor device according to the present invention. In the diagram, numeral 1 indicates a semiconductor substrate including a pair of principal surfaces 11 and 12, an n-type layer 13 including a first layer portion 131 (n⁻) formed apart from the principal surfaces and a second layer portion 132 which is adjacent to the first layer portion 131 and which has an impurity concentration higher than that of the layer 131, a $p_1^+$-type layer which is adjacent to the second layer portion 132 of the n-type layer 13 and the principal surface 12 and which has an impurity concentration higher than that of the layer 132, a p-type layer 15 including a first layer portion 151 which is adjacent to the principal surface 11 and the first layer portion 131 of the n-type layer 13 and which has an impurity concentration higher than that of the layer 131 and a second layer portion 152 which extends from the principal surface 11 into the first layer portion 151 and which has an impurity concentration higher than that of the layer 151, an $n_1^+$-type layer 16 which extends from the principal surface 11 into the p-type layer 15, a substantial portion of which is adjacent to the second layer portion 152, and which has an impurity concentration higher than that of the layer 152, an $n_2^+$-type layer 17 which is adjacent to the principal surface 11, which extends into the portion 131 of the n-type layer 13 and the portion 151 of the p-type layer 15, and which has an impurity concentration higher than those of both layers 131 and 151, and a $p^-$-type layer 18 which is formed apart from the portion 151 of the p-type layer 15 between the portion 131 of the n-type layer 13 and the $n_2^-$-type layer 17, and which has an impurity concentration between those of the layers 131 and 17. Numeral 2 indicates a cathode electrode which is brought into contact via a low resistance with the $n_1^+$-type layer 16 and the portion 152 of the p-type layer 15 in the principal surface 11 of the semiconductor substrate, a numeral 3 denotes an anode electrode which is brought into contact via a low resistance with the $p_1^+$-type layer 14, and a numeral 4 designates an insulated gate electrode which is mounted via an insulated layer 5 on a surface of the portion 151 of the p-type layer 15 exposed in the principal surface 11 of the semiconductor substrate between the $n_1^+$-type layer 16 and the $n_2^+$-type layer 17. The portion 152 of the p-type layer 15 is, at a position apart from the electrode 4, adjacent to the $n_1^+$-type layer 16, whereas the $p^-$-type layer 18 is, at a position apart from the electrode 4, adjacent to the $n_2^+$-type layer 17. As such, the complex semiconductor device incorporates a thyristor including a pnp transistor ($Q_1$) including the $p_1^+$-type layer 14, the n-type layer 13, and the $p^-$-type layer 18 and an npn transistor ($Q_2$) including the n-type layer 13, the $p^-$-type layer 18, and the $n_2^+$-type layer 17. In addition, it also incorporates an IGBT region including an n-channel MISFET ($M_1$) including the insulated gate electrode 4, the $n_1^+$-type layer 16, the portion 151 of the p-type layer 15, and the $n_2^+$-type layer 17; an npn transistor ($Q_3$) including the $n_1^+$-type layer 17, the p-type layer 15, and the n-type layer 13; and a pnp transistor ($Q_4$) including the p-type layer 15, the n-type layer 13, and the $p_1^+$-type layer 14. Namely, the complex semiconductor device of FIG. 1 can be regarded as a complex device in which, as indicated by the equivalent circuit of FIG. 2, the IGBT and the thyristor are connected on the cathode side by the common n-channel MISFET ($M_1$).

Figure 2:
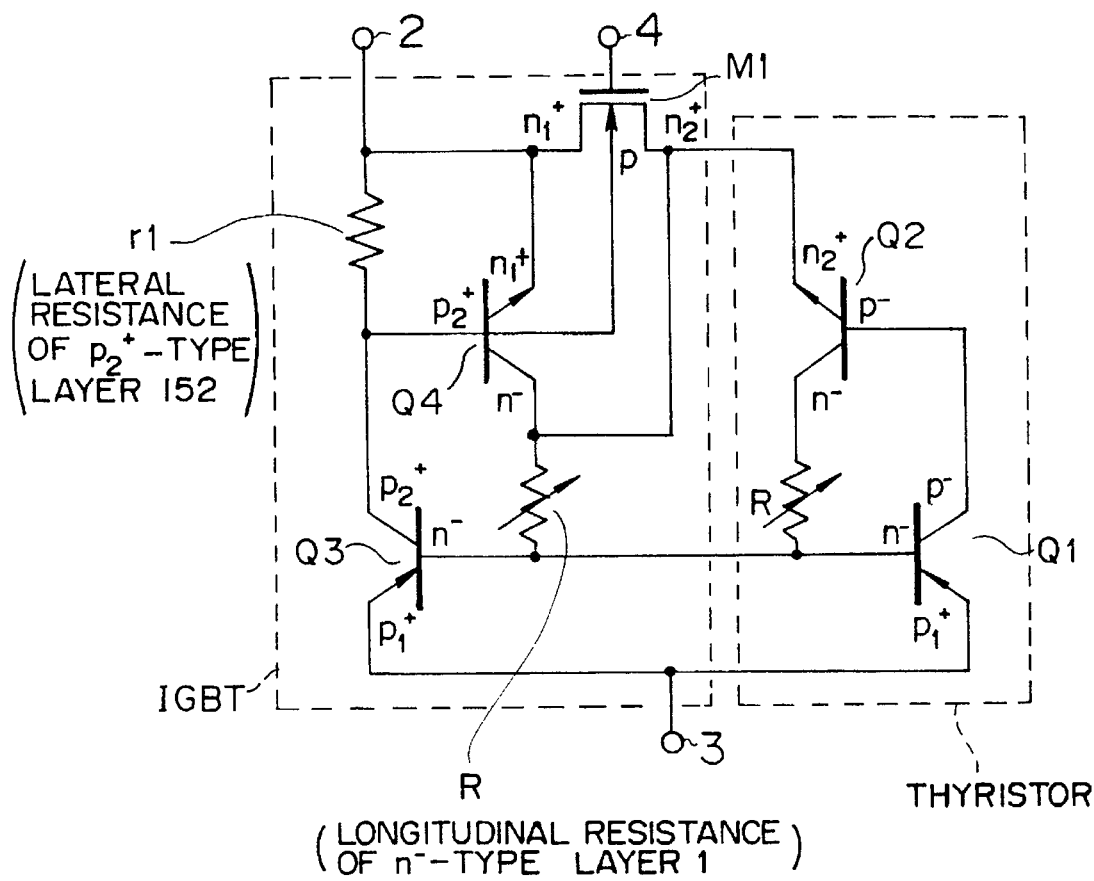
FIG. 2 is an equivalent circuit diagram of the complex semiconductor device shown in FIG. 1.

Next, the operation principle will be described by reference to FIGS. 1 and 2. First, to turn the complex semiconductor device on, a negative potential and a positive potential are applied respectively to the cathode and anode electrodes 2 and 3 such that the insulated gate electrode 4 is applied with a potential larger in terms of positive potential than that of the cathode electrode 2. Resultantly, an inversion layer (channel) is formed in a surface of the portion 151 of the p-type layer 15 below the insulated gate electrode 4. Hence, the $n_1^+$-type layer 16 is connected via the inversion layer of the portion 131 of the n-type layer 13 to the $n_2^+$-type layer 17, thereby turning the so-called n-channel MISFET ($M_1$) on. As a result, electrons (MIS current) injected from the cathode electrode 2 via the n-channel MISFET ($M_1$) pass the n-type layer 13 and then flow into the $p_1^+$-type layer 14. This causes the pnp transistors ($Q_1$ and $Q_3$) to operate, and, hence, holes are injected from the $p_1^+$-type layer 14 into the n-type layer 13. When the hole current flows into the $p^-$-type layer 18, the potential of the $p^-$-type layer 18 is increased. When the potential difference exceeds the diffusion potential between the $p^-$-type layer 18 and the $n_2^+$-type layer 17 (about 0.7 V in silicon at the room temperature), the npn transistor ($Q_2$) operates and then electrons are injected from the $n_2^+$-type layer 17 directly into the n-type layer 13. As a result, the thyristor including the pnp transistor ($Q_1$) and the npn transistor ($Q_2$) ignites so as to thereby set the complex semiconductor device to the on state. In this regard, the resistance $r_2$ is sufficiently small due to the high impurity concentration of the portion 152 of the p-type layer 15, and, hence, a parasitic thyristor including the $n_1^+$-type layer 16, the portion 152 of the p-type layer 15, the n-type layer 13, and the $p_1^+$-type layer 14 cannot be easily turned on. Moreover, the portion 132 of the n-type layer 13 having a relatively high impurity concentration suppresses the hole injection effect of the pnp transistors ($Q_1$ and $Q_3$) and is disposed to prevent latch-up of the parasitic thyristor and to decrease the loss due to a tail current in a turn-off operation. Consequently, the impurity concentration and the thickness thereof are to be set according to characteristics of the desired complex semiconductor device, and, hence, there may be employed another means only if the hole injection effect can be suppressed by the means. For example, a construction can be provided in which the portion 132 of the n-type layer 13 is partially connected to the anode electrode 3 via a short circuit. Alternatively, an arrangement can be provided to lower the lifetime of minority carriers in the portion 132 in the vicinity of junction between the $p_1^+$type layer 14 and the n-type layer 13.

On the other hand, to turn the device off, the potential of the insulated gate electrode 4 is set to a value equal to or less than that of the cathode electrode 2 such that the inversion layer is resultantly extinguished from the surface of the portion 151 of the p-type layer 15 below the insulated gate electrode 4. The electron injection from the $n_1^+$-type layer 16 into the $n_2^+$-type layer 17 is interrupted and that from the $n_2^+$-type layer 17 into the n-type layer 13 is simultaneously interrupted. As a result, the hole injection from the $p_1^+$-layer 14 is stopped, and, hence, the complex semiconductor device is set to the off state.

Figure 3:
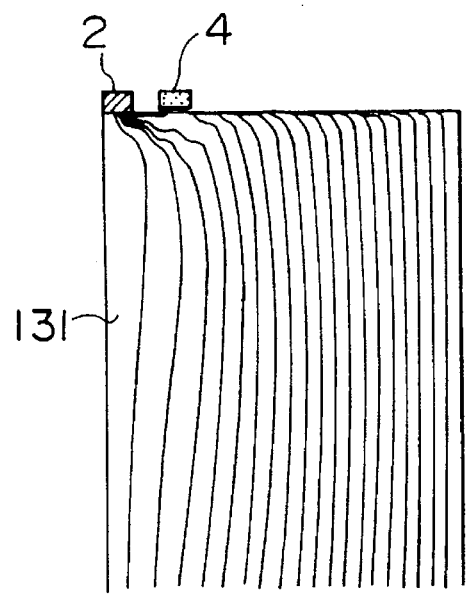
FIG. 3 is a diagram showing lines of current flow in the on state of the complex semiconductor device shown in FIG. 1.
Figure 28:
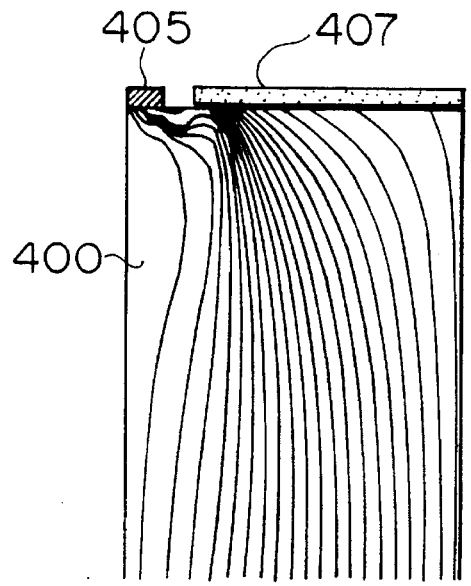
FIG. 28 is a diagram showing lines of current flow in the on state of the IGBT shown in FIG. 26.
Figure 29:
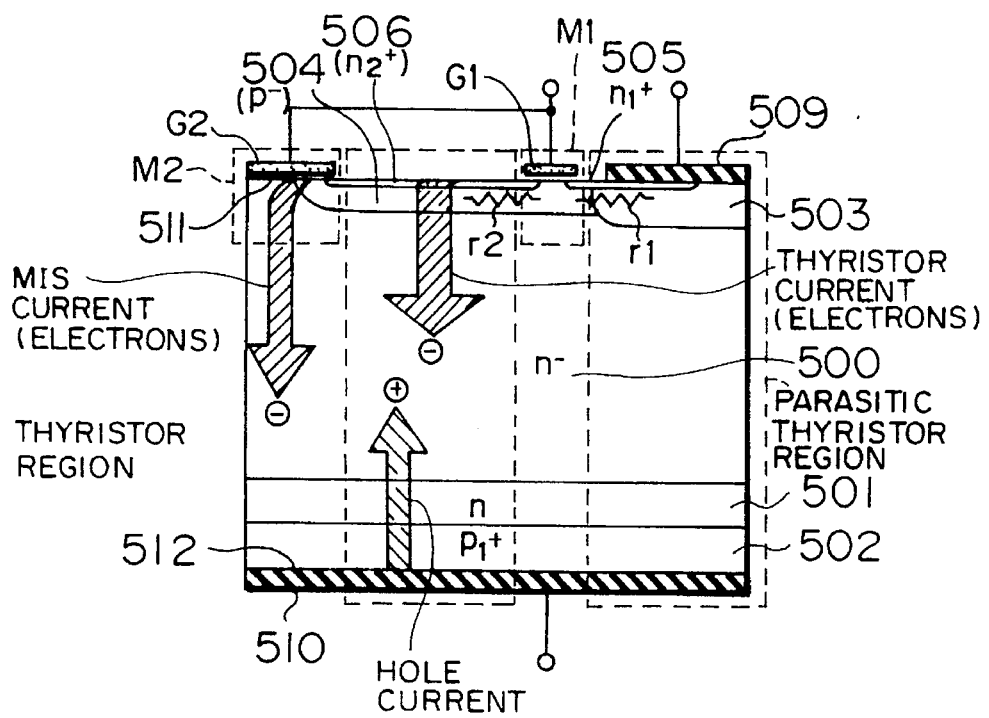
FIG. 29 is a schematic cross-sectional diagram of a semiconductor device as a prior technology of the present invention in which a thyristor is controlled by an insulated gate electrode.
Figure 30:
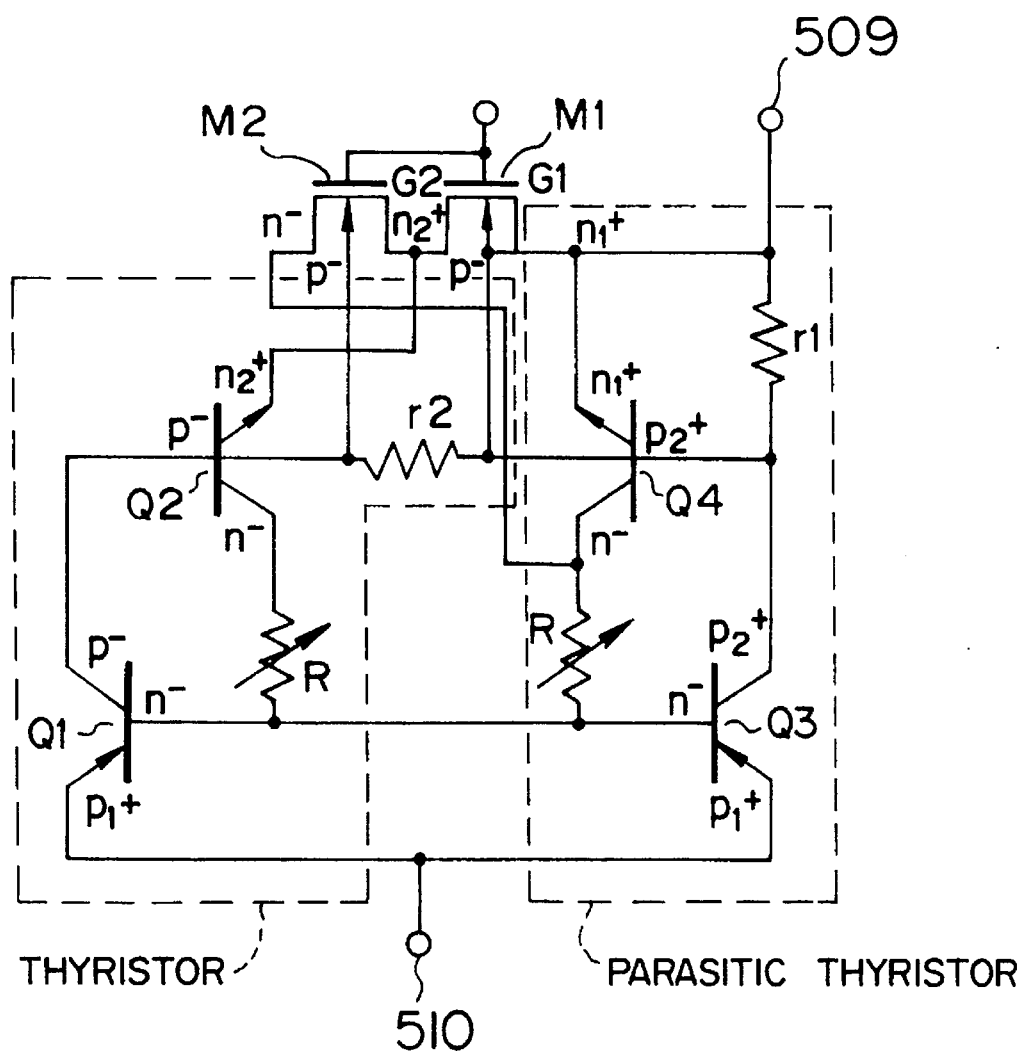
FIG. 30 is an equivalent circuit diagram of the semiconductor device shown in FIG. 29.

FIG. 3 shows simulation results of lines of current flow on the side of the cathode electrode 2 in the stationary on state of the complex semiconductor device of FIG. 1. Since the thyristor region is added to the IGBT in the best form, when compared with lines of current flows of the conventional IGBT shown in FIG. 28, electrons supplied from the cathode electrode 2 via the MIS channel uniformly flow in a state where the electrons are fully extended in the thyristor region. Consequently, the on-state voltage can be sufficiently lowered. Furthermore, since the portion 151 of the p-type layer 15 disposed in the IGBT region is separated from the $p^-$-type layer 18 disposed in the thyristor region, the $n_2^+$-type layer 17 of the thyristor region is partially brought into contact with the n-type layer 13, thereby controlling the MIS current and the thyristor current by one n-channel MISFET ($M_1$). Namely, the MIS current necessary to ignite the thyristor is required to pass only one channel resistance. Moreover, in the thyristor section, the current passes only one channel resistance. Consequently, the thyristor can be easily ignited by a small MISFET region (channel width). Capability of minimizing the small MISFET region (channel width) means that the area of the thyristor in the overall device can be increased and hence the on-state voltage can be sufficiently decreased. Moreover, since the $p^-$-type layer 18 of the thyristor region is floating in potential with respect to the p-type layer 15, the potential of the $p^-$-type layer 18 can be easily and uniformly increased due to the hole current supplied. As a result, the thyristor can be easily ignited, and the overall thyristor region contributes to the operation; consequently, the on-state voltage can be sufficiently reduced. That is, a high breakdown voltage and a large current can be easily achieved. In addition, since the area of the insulated gate electrode can be remarkably minimized as compared with the conventional device, there is required only a small charge/discharge current of the gate. This leads to an advantage that the switching operation speed is increased and the gate circuit size is decreased.

Furthermore, the complex semiconductor device of FIG. 1 can be easily turned on and off by applying and removing a potential to and from the insulated gate electrode. Thanks to adoption of the saturation characteristic of the n-channel MISFET ($M_1$), there is attained an aspect of a current limiting action even in the thyristor operation. Ordinarily, when manufacturing the semiconductor devices, the structure of FIG. 1 is adopted as a cell such that each product includes several hundred to several tens of thousand of cells integrated in an identical semiconductor substrate for a parallel operation thereof. In this situation, when the current limiting action is possessed by each cell, the current cannot be concentrated onto any particular one cell but is uniformly loaded onto the respective cells and hence it is possible to prevent destruction of the semiconductor device due to the current concentration. Namely, there is obtained an advantage that by quite a simplified gate circuit, the on and off control of the semiconductor device can be conducted with a current larger than that of the conventional device without destroying the device.

Figure 4A:
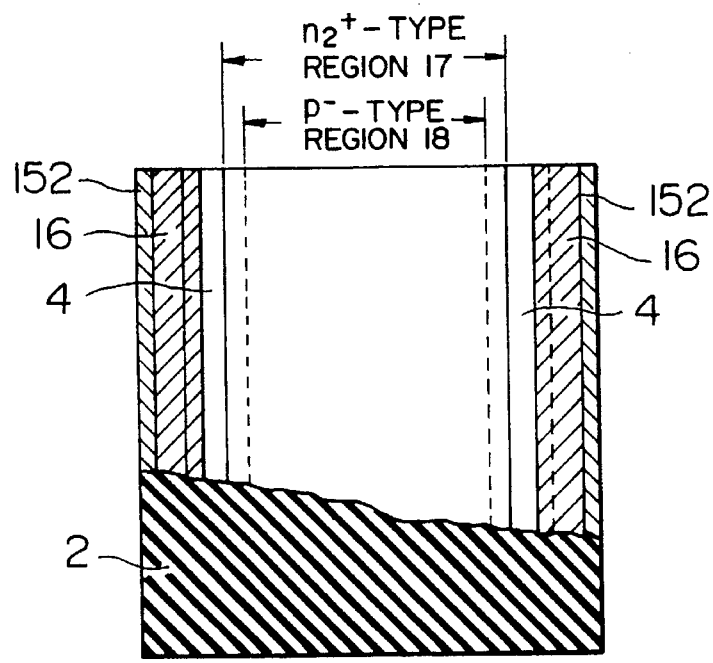
FIGS. 4A and 4B are a schematic plan view and a perspective cross-sectional view showing a specific example of the complex semiconductor device shown in FIG. 1.
Figure 4B:
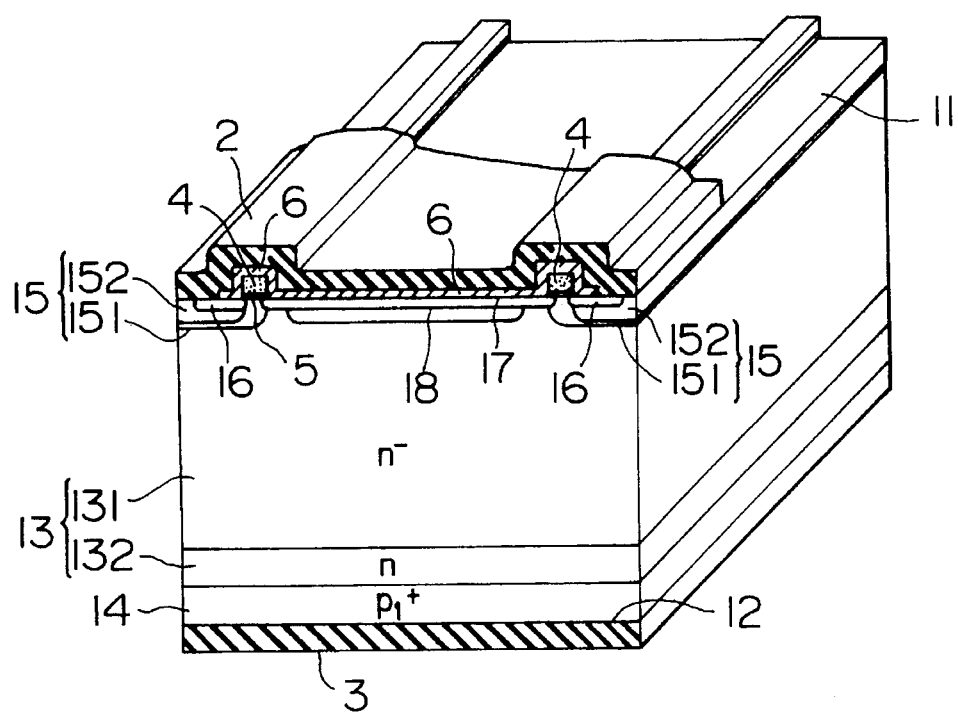

FIGS. 4A and 4B are a plan view and a cross-sectional bird's-eye view showing a specific example of a unitary cell of a semiconductor device similar to the embodiment of FIG. 1. Description will be given only the portions different from the associated portions of FIG. 1. The cathode electrode 2, which is disposed on the overall surface of the principal surface 11, establishes an ohmic contact with the $n_1^+$-type layer 16 and the portion 152 of the p-type layer 15 and is electrically insulated by an insulation layer 6 from the insulated gate electrode 4 and the $n_2^+$-type layer 17. However, in the diagram, for easy understanding of the shape of the insulated gate electrode, the cathode electrode 2 and the insulation layer 6 are partially removed. With the provision above, the fine machining of the cathode electrode 2 is unnecessitated; moreover, the electric resistance in each region from the cathode electrode 2 to the $n_1^+$-type layer 16 and the portion 152 of the p-type layer 15 of each cell can be minimized. In addition, there is attained an effect of improving the heat dissipation efficient from the semiconductor substrate 1. In this regard, the right and left insulated gate electrodes 4 shown in this diagram are not independent of each other but are connected to each other at a position not shown in the diagram.

Figure 5:
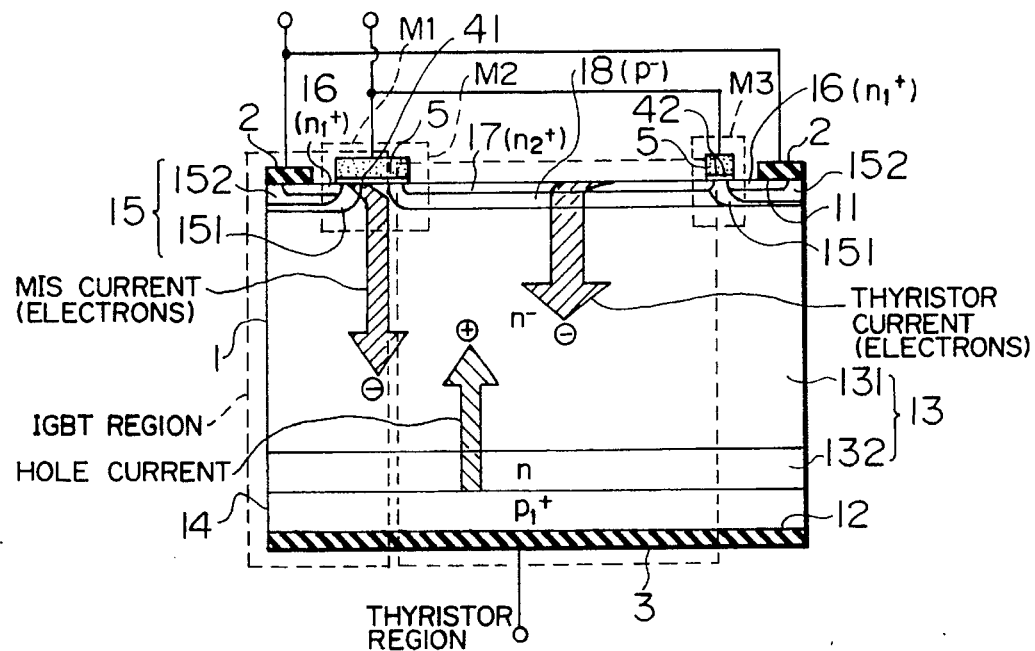
FIG. 5 is a schematic cross-sectional view showing another embodiment of a complex semiconductor device according to the present invention.
Figure 6:
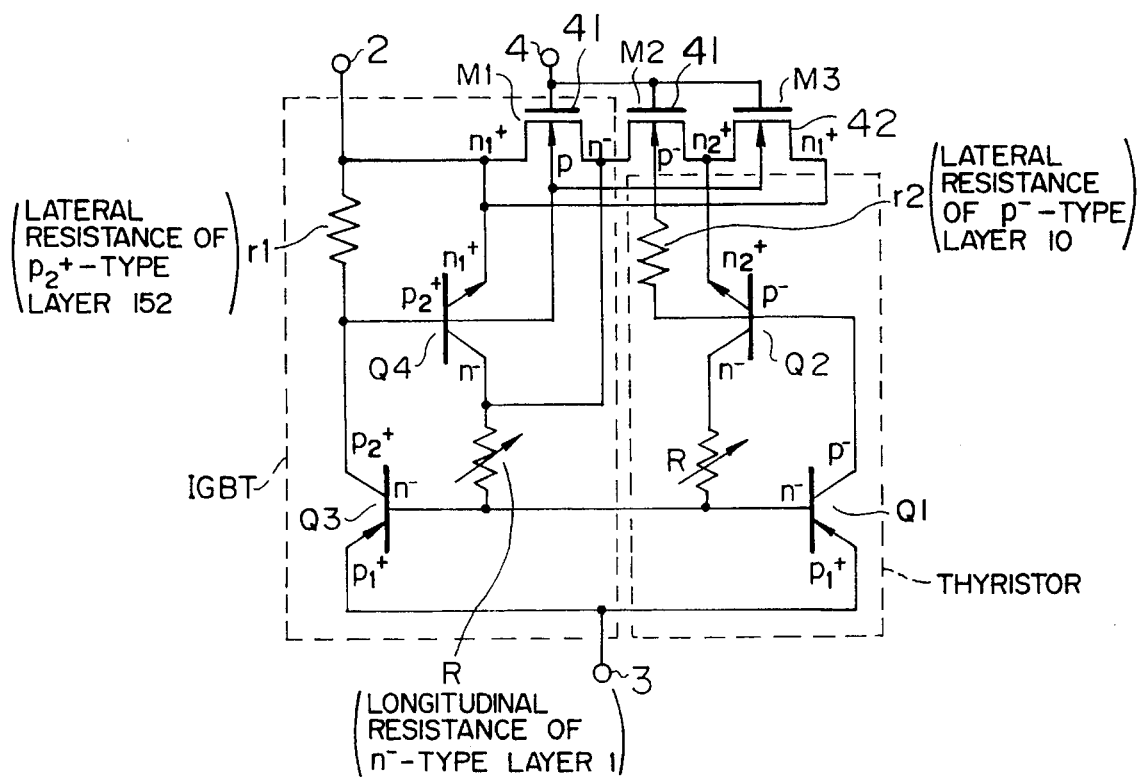
FIG. 6 is an equivalent circuit diagram of the complex semiconductor device shown in FIG. 5.

FIG. 5 is a schematic cross-sectional view showing another embodiment of the present invention. The complex semiconductor device is different from that of FIG. 4 in that the $n_2^+$-type layer 17 is enclosed with the $p^-$-type layer 18 on the left-hand side of the diagram and the portion 151 of the p-type layer 15 is separated from the $p^-$-type layer 18 by the portion 131 of the n-type layer 13, and the p⁻-type layer 18 is brought into contact with the portion 151 of the p-type layer 15 on the right-hand side. The gate length of the insulated gate electrode 41 in the portion arranged on the left side is formed to be more than that of the portion 42 disposed on the right side. The complex semiconductor device of this embodiment has therein a thyristor including a pnp transistor ($Q_1$) including the $p_1^+$-type layer 14, the n-type layer 13, and the p⁻-type layer 18 and an npn transistor ($Q_2$) including the n-type layer 13, the p⁻-type layer 18, and the $n_2^+$-type layer 17. Moreover, there are included an n-channel MISFET ($M_1$) including the left-side portion 41 of the insulated gate electrode 4, the $n_1^+$-type layer 16, the p-type layer 15, and the n-type layer 13; an IGBT region including the left-side portion of the insulated gate electrode 4, the $n_1^+$-type layer 16, the p-type layer 15, the n-type layer 13, and the $p_1^+$-type layer 14 ($Q_3$, $Q_4$); an n-channel MISFET ($M_2$) including the left-side insulated gate electrode 4, the n-type layer 13, the p⁻-type layer 18, and the $n_2^+$-type layer 17; and an n-channel MISFET ($M_3$) including the right-side portion 42 of the insulated gate electrode 4, the $n_1^+$-type layer 16, the portion 151 of the p-type layer 15, and the $n_2^+$-type layer 17. That is, the semiconductor device is assumed to be a complex of the IGBT and the thyristor. FIG. 6 shows an equivalent circuit of the complex semiconductor device of FIG. 5.

Next, the operation principle will be described by reference to FIGS. 5 and 6. First, to turn the complex semiconductor device on, a negative potential and a positive potential are applied respectively to the cathode and anode electrodes 2 and 3 such that the insulated gate electrode 4 is applied with a potential larger in terms of positive potential then that of the cathode electrode 2. Resultantly, electrons (MIS current) injected from the cathode electrode 2 via the n-channel MISFET ($M_1$) pass the n-type layer 13 to flow into the $p_1^+$-type layer 14. The pnp transistor ($Q_1$) then operates and hence holes are injected from the $p_1^+$-type layer 14 into the n-type layer 13. When the hole current flows into the p⁻-type layer 18, the voltage drop due to the resistance $r_2$ of the p⁻-type layer 18 increases the potential of the p⁻-type layer 18. When the potential of the p⁻-type layer 18 exceeds the diffusion potential between the p⁻-type layer 18 and the $n_2^+$-type layer 17, the electrons fed from the $n_1^+$-type layer 16 via the n-channel MISFET ($M_3$) into the $n_2^+$-type layer 17 are injected to the n-type layer 13 thanks to the operation of the npn transistor ($Q_2$). At the same time, the electrons flown from the $n_1^+$-type layer 16 via the n-channel MISFET ($M_1$) and the n-channel MISFET ($M_2$) into the $n_2^+$-type layer 17 are injected to the n-type layer 13 thanks to the operation of the npn transistor ($Q_2$). As a result, the hole injection from the $p_1^+$-type layer is further increased and hence the thyristor including the pnp transistor ($Q_1$) and the npn transistor ($Q_2$) ignites and the complex semiconductor device is set to the on state. In this regard, the resistance $r_2$ is sufficiently small due to the high impurity concentration of the portion 152 of the p-type layer 15 and the parasitic thyristor including the $n_1^+$-type layer 16, the portion 152 of the p-type layer 15, the n-type layer 13; consequently, the $p_1^+$-type layer 13 cannot be easily turned on.

On the other hand, to turn the device off, the potential of the insulated gate electrode 4 is set to a value equal to or less than that of the cathode electrode 2 such that n-channel MISFET ($M_1$), the n-channel MISFET ($M_2$), and the n-channel MISFET ($M_3$) are turned off. In consequence, the electron current from the $n_1^+$-type layer to the n-type layer 13 and that from the $n_1^+$-type layer 16 to the $n_2^+$-type layer 17 are interrupted, and hence the electron injection from the $n_2^+$-type layer 17 to the n-type layer 13 is interrupted. As a result, the hole injection from the $p_1^+$-layer 14 is stopped and the complex semiconductor device is set to the off state.

In the complex semiconductor device of this embodiment, the MIS current necessary to ignite the thyristor is required to pass only one channel resistance of the n-channel MISFET ($M_1$); moreover, the electron current of the thyristor is required to pass at least one channel resistance of the n-channel MISFET ($M_3$). Consequently, the thyristor can be easily ignited by a small MISFET region (channel width) and the voltage drop can be fully minimized. Capability of minimizing the MISFET region (channel width) means that the area of the thyristor in the overall device can be increased and hence the on-state voltage can be sufficiently decreased. That is, a high breakdown voltage and a large current can be readily attained for the device.

Furthermore, the complex semiconductor device of this embodiment can be easily turned on and off by applying and removing a potential to and from the insulated gate electrode 4. Since there are used the saturation characteristic of the n-channel MISFET ($M_1$), a current limiting action is obtained even in the thyristor operation. Ordinarily, using the structure of FIG. 5 as a cell, there are integrated several hundred to several tens of thousand of cells in a semiconductor substrate for a parallel operation thereof. In this situation, when the current limiting action is possessed by each cell, the current cannot be concentrated onto any special one cell but is uniformly loaded onto the respective cells and hence it is possible to prevent destruction of the semiconductor device due to the current concentration. Namely, there is obtained an aspect that by quite a simplified gate circuit, the semiconductor device can be turned on and off by a current larger than that of the conventional device without destroying the device.

This embodiment is superior in reproducibility of the breakdown voltage as compared with the complex semiconductor device shown in FIG. 1 and hence there is obtained an advantage of easy production of the device. Namely, the complex semiconductor device shown in FIG. 1 has a portion of the $n_2^+$-type layer 17 which is directly brought into contact with the portion 131 of the n-type layer 13, and the breakdown voltage varies depending on the width of the portion. For example, although the breakdown voltage is not lowered even when the width is decreased, the breakdown voltage is minimized when the width is increased excessively. In consequence, the device production is restricted by a condition that the width thereof is required to be fabricated with a satisfactory reproducibility. In contrast thereto, according to the structure shown in FIG. 5, there is missing the portion of the $n_2^+$-type layer 17 which is directly brought into contact with the portion 131 of the n-type layer 13. Consequently, the construction can be implemented by the ordinary self-aligning technology, thereby solving the problem similar to that of FIG. 1.

Figure 7A:
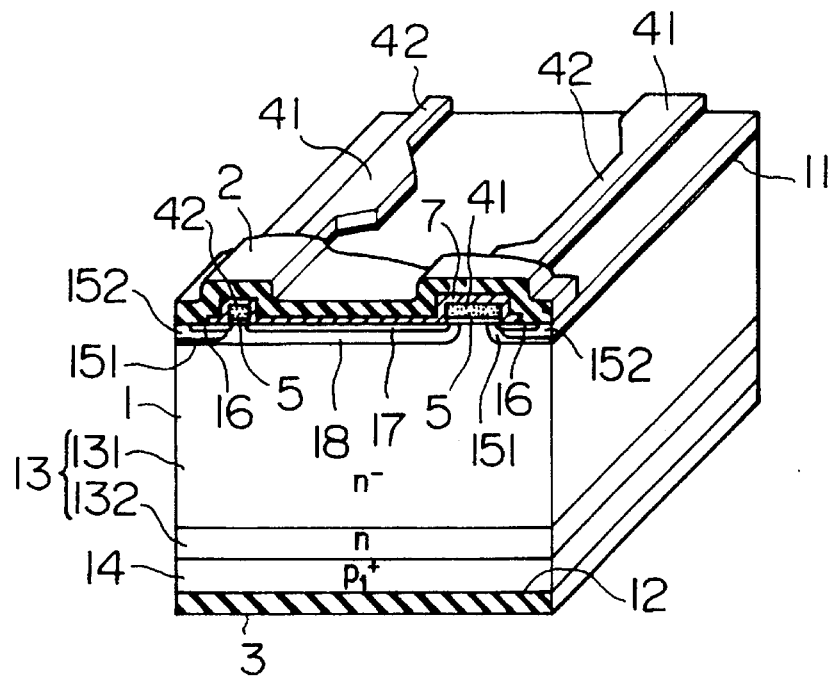
FIGS. 7A and 7B are perspective cross-sectional views showing cross sections of a variation of the complex semiconductor device shown in FIG. 5.
Figure 7B:
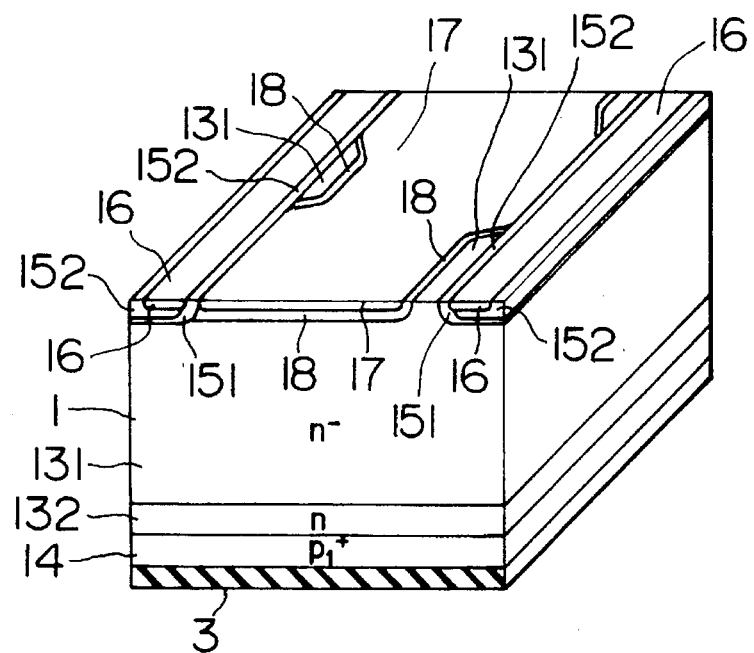

FIGS. 7A and 7B are perspective cross-sectional views schematically showing a variation of the complex semiconductor device shown in FIG. 5. In this connection, FIG. 7B shows a state in which the electrode and the insulation layer are removed from the principal surface 11 of the device shown in FIG. 7A. Although the left and right sides are interchanged, the cross section is identical to that of FIG. 5. The difference with respect to FIG. 5 resides in that the insulated gate electrode 4 is manufactured such that a portion 41 having a longer gate length shown on the left-hand side of FIG. 5 and a portion 42 having a shorter gate length shown on the right-hand side are alternately provided. This formation leads to an effect that the thyristor region uniformly operates in the overall semiconductor device to reduce the on-state voltage. Namely, as can be understood from the equivalent circuit of FIG. 6, for the current flowing into the thyristor region, there exist two paths including a first path from the cathode electrode via the n-channel MISFET ($M_1$) and the n-channel MISFET ($M_2$) and a second path therefrom via the n-channel MISFET ($M_3$). In consideration of the on-state resistance of the MISFET, the second path has a lower resistance and hence the current flowing into the thyristor region passes primarily through the second path. In consequence, when the portion 41 having a longer gate length and the portion 42 having a shorter gate length are configured on both sides of the thyristor region to be uniformly distributed therein, the overall thyristor region contributes to the conduction, thereby decreasing the on-state voltage.

Furthermore, the cathode electrode 2 is electrically insulated from the insulated gate electrode 4 by the insulation layer 7 so as to be disposed in the overall surface of the principal surface 11. However, in the diagram, for easy understanding of the shape of the insulated gate electrode, the cathode electrode 2 and the insulation layer 7 are partially removed. With the provision, the fine machining of the cathode electrode 2 is unnecessary, and the electric resistance from the cathode electrode 2 to the $n_1^+$-type layer 17 and the portion 152 of the p-type layer 15 of each cell can be reduced. Moreover, there is attained an effect to improve the heat dissipation efficiency from the semiconductor substrate. The complex semiconductor device seems to have a complicated shape in the cross section; however, as can be seen from FIGS. 7A and 7B, the shape can be quite simple in the plan view. When the portion 151 of the p-type layer 15 and the $p^-$-type layer 18 are formed according to the gate self-alignment, the gate length of the portion 41 having the longer gate length of the insulated gate electrode 4 is set to be larger than the sum of the diffusion depths of the portion 151 of the p-type layer 15 and the $p^-$-type layer 18, and the gate length of the portion 42 having the shorter gate length of the insulated gate electrode 4 is set to be equal to or less than the sum of the diffusion depths of the portion 151 of the p-type layer 15 and the $p^-$-type layer 18 (preferably, equal to or less than the diffusion depth of the portion 151 of the p-type layer 15). Resultantly, there can formed in the self-alignment the n-channel MISFETs ($M_1$) and ($M_2$) below the portion 41 of the electrode 4 and the n-channel MISFETs ($M_3$) below the portion 42. In consequence, the complex semiconductor device can be easily produced without using any complicated shape in the plan view and any special technology.

Figure 8:
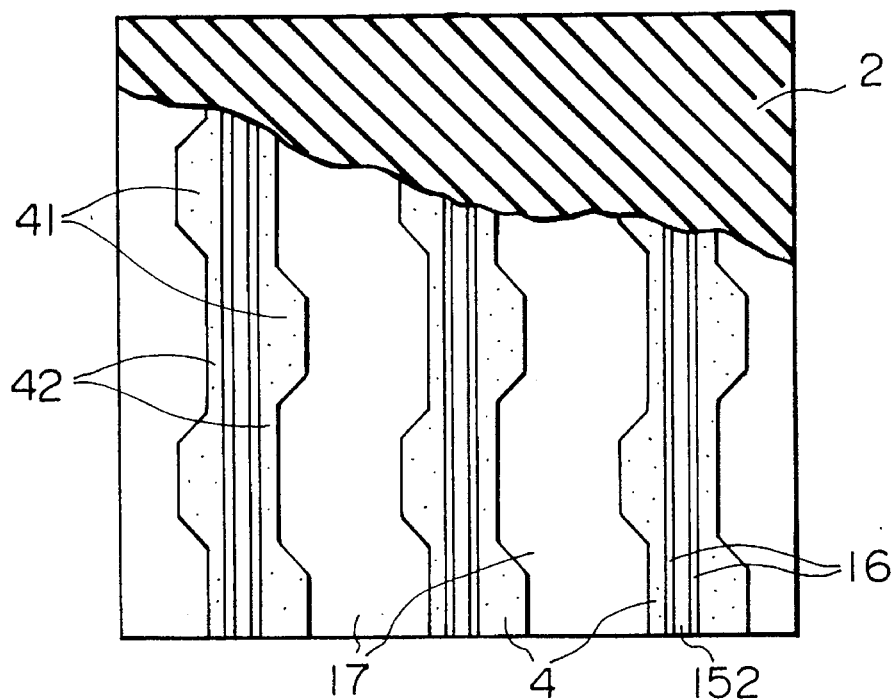
FIG. 8 is a schematic plan view on the side of an insulated gate electrode showing a variation of the complex semiconductor device shown in FIG. 7.
Figure 9:
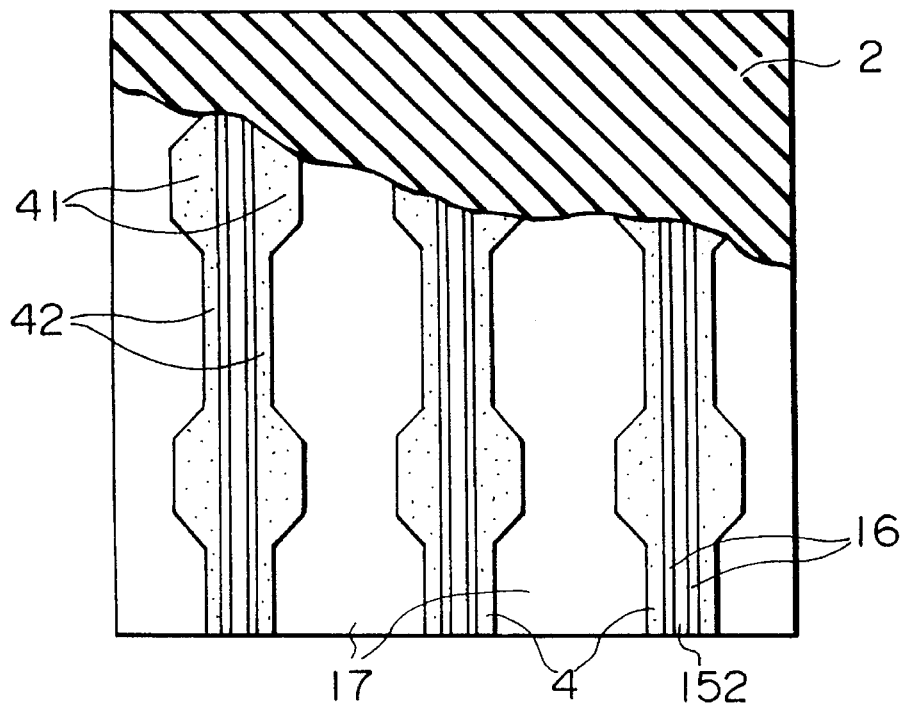
FIG. 9 is a schematic plan view on the side of an insulated gate electrode showing another variation of the complex semiconductor device shown in FIG. 7.
Figure 10:
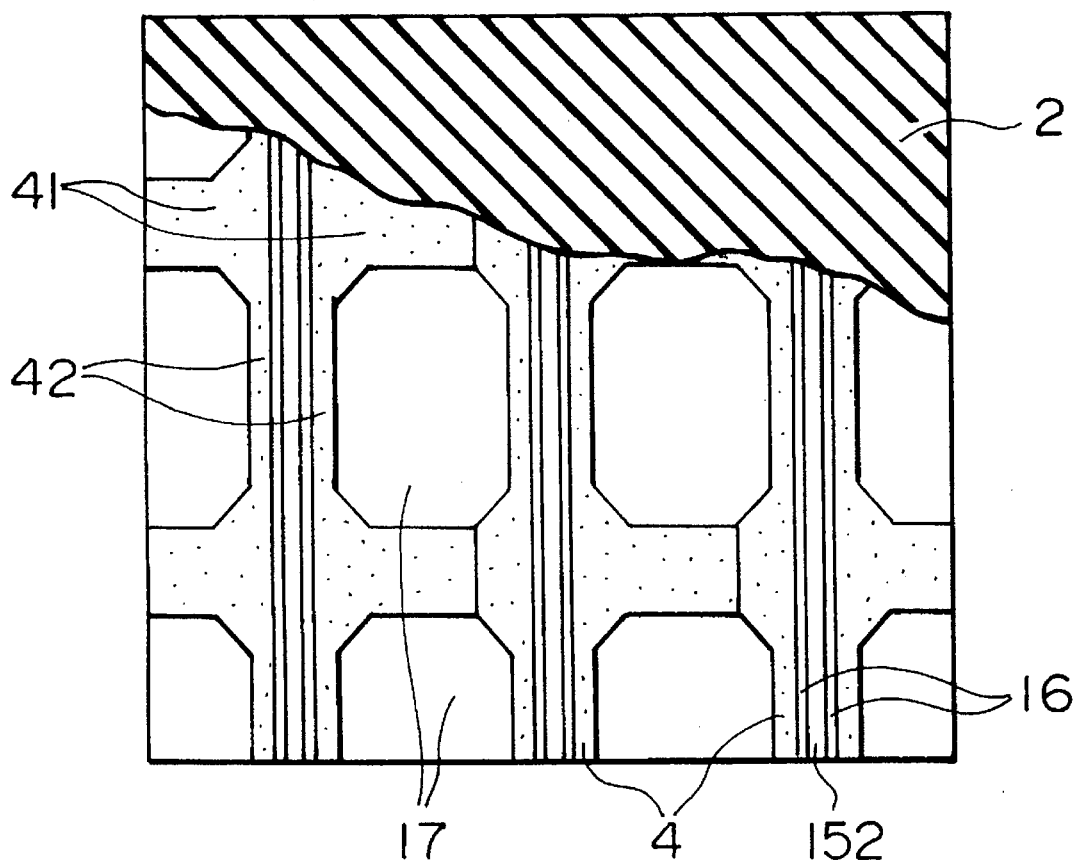
FIG. 10 is a schematic plan view on the side of an insulated gate electrode showing still another variation of the complex semiconductor device shown in FIG. 7.

FIGS. 8 to 10 are schematic plan views on the insulted gate electrode side showing a variation of the complex semiconductor device shown in FIGS. 7A and 7B. In FIG. 8, the portion 41 having the longer gate length and the portion 42 having the shorter gate length of the insulated gate electrode 4 are formed alternately in a direction such that the portions 41 and 42 are adjacent to each other between the adjacent ones of a plurality of insulated gate electrodes arranged in parallel in a direction vertical to the direction. FIG. 9 shows a case in which the portions 41 are adjacent to each other and the portions 42 are adjacent each other. FIG. 10 shows a case in which the portion 41 are connected to each other in FIG. 9. In the configuration of FIG. 8, the IGBT regions are uniformly distributed and hence the switching speed of on and off operations is increased. In the configuration of FIG. 9, the thyristor region adjacent to the n-channel MISFET ($M_3$) of the insulated gate region 42 becomes wide and the thyristor region adjacent to the n-channel MISFETs ($M_1$) and ($M_2$) of the insulated gate region 42 becomes narrow. Consequently, the thyristor regions can be effectively operated and the on-state voltage can be minimized. In the configuration of FIG. 10, the on-state voltage can be reduced like in the case of FIG. 9. These examples are described only for explanation, namely, there can be considered various other variations. However, since the area of the thyristor is increased when the area of the gate electrode becomes smaller, the on-state voltage can be decreased. In addition, it is favorable since the charge/discharge current is reduced for the capacitor formed by the insulated gate electrode. In consequence, it is desired to obtain a configuration in the plan view in which the area of the insulated gate electrode is possibly minimized under the condition that the ignition characteristic and the arc extinction characteristic of the complex semiconductor device are not deteriorated. Incidentally, the insulated gate electrodes shown in FIGS. 7A and 7B and FIGS. 8 and 9 are not dependent of each other but are connected to each other at positions not shown in the diagrams.

Figure 11:
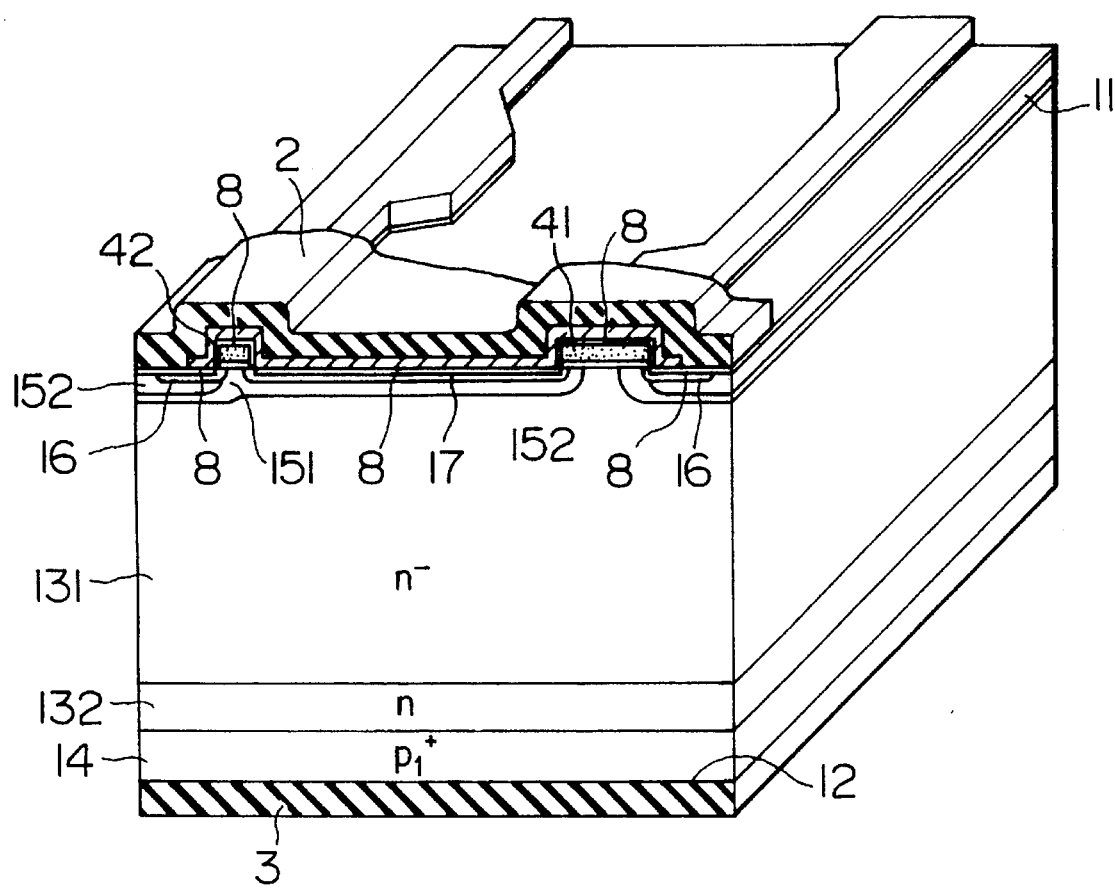
FIG. 11 is a schematic perspective view showing a variation of the complex semiconductor device shown in FIG. 7.

FIG. 11 is a schematic perspective view showing a variation of the complex semiconductor device shown in FIGS. 7A and 7B. Description will be given only of the different points with respect to FIG. 7. In this configuration, a low-resistance layer 8 is disposed on the $n_1^+$-type layer 16, the $n_2^+$-type layer 17, the portion 152 of the p-type layer 15, and the insulated gate electrode 4 to reduce the lateral resistance of the respective layers. Assume that there is formed, for example, a 400 nm thick titanium silicide as the layer 8. Then, the sheet resistance is about 0.5 Ω/□. Resultantly, the lateral resistance particularly of the $n_2^+$-type layer 17 is decreased and hence the electrons flown from the $n_1^+$-type layer 16 via the n-channel MISFET ($M_3$) into the $n_2^+$-type layer 17 can be easily extended in the overall region of the $n_2^+$-type layer 17. As a result, the operation of the thyristor including the pnp transistor ($Q_1$) including the $p_1^+$-type layer 14, the n-type layer 13, and the $p^-$-type layer 18 and the npn transistor ($Q_2$) including the n-type layer 13, and the $p^-$-type layer 18, and the $n_2^+$-type layer 17 is likely to uniformly take place in the overall region of the $n_2^+$-type region 17, thereby further reducing the on-state voltage. In addition, since the lateral resistance of the insulated gate electrode is minimized, the charge/discharge time of the capacitor formed by the insulated gate electrode is reduced and the uniformity of operation of the plural cells distributively arranged in the complex semiconductor device is enhanced. this leads to an advantageous effect of increase in the switching speed and the strength against breakdown.

Figure 12A:
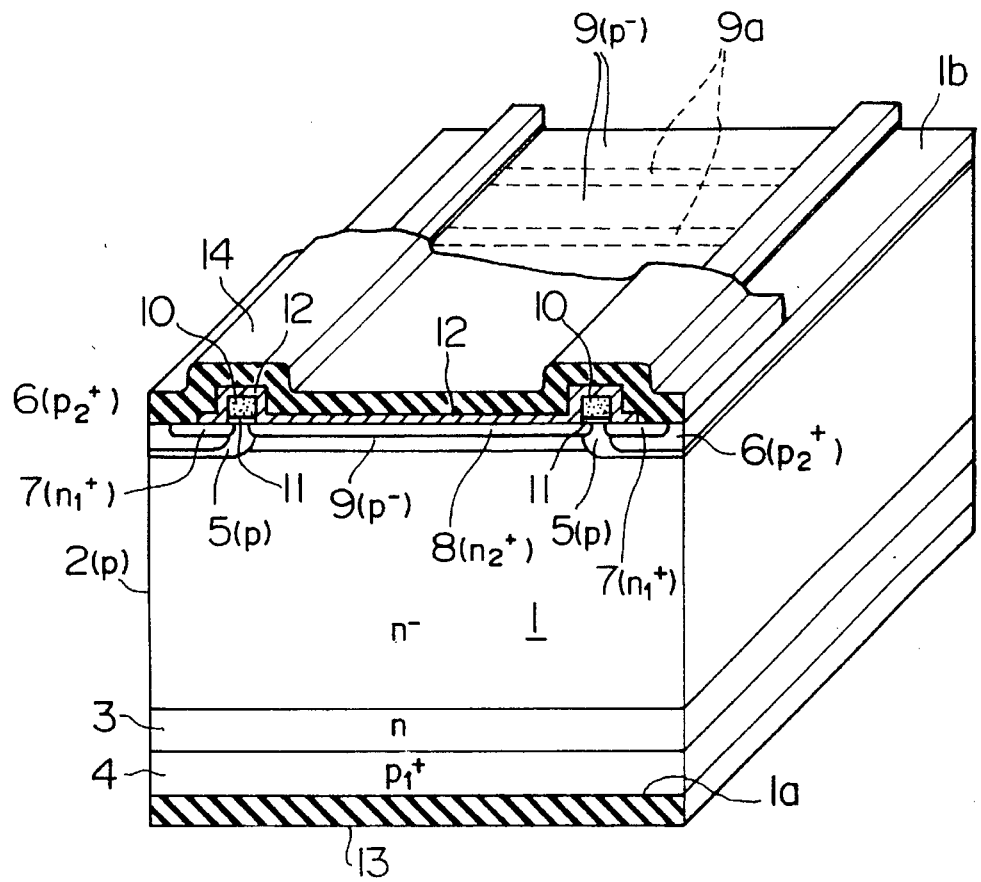
FIGS. 12A and 12B are a schematic perspective cross-sectional view and a schematic plan view showing the configuration of another embodiment of the complex semiconductor device according to the present invention.
Figure 12B:
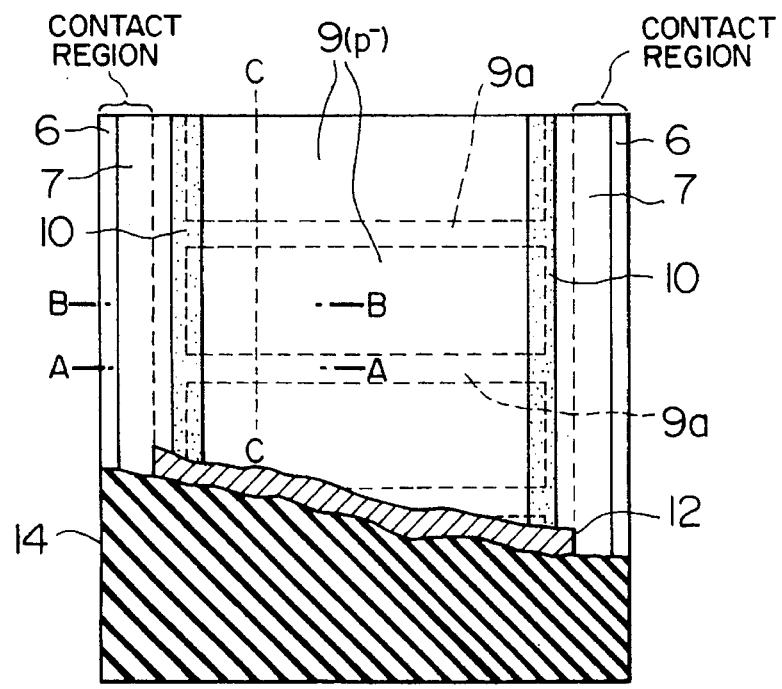

FIGS. 12A and 12B show the configuration of another embodiment of the complex semiconductor device of the present invention. FIG. 12A is a schematic perspective cross-sectional view in which the cathode electrode and the insulation layer are partially removed, whereas FIG. 12B is a plan view in which the cathode electrode and the insulation layer are partially removed in the similar manner.

In FIGS. 12A and 12B, numeral 1 indicates a semiconductor substrate, numeral 1a denotes a principal surface, numeral 1b designates another principal surface, numeral 2 stands for an n-type layer of a low impurity concentration ($n^-$-type layer, first semiconductor layer), numeral 3 indicates an n-type impurity layer (n-type layer, first semiconductor layer,) which is adjacent to the $n^-$-type layer 2 on the side of the principal surface 1a and which has an impurity concentration higher than that of the $n^-$-type layer 2, numeral 4 denotes a first p-type layer having a high impurity concentration ($p_1^+$-type layer, second semiconductor layer) which is adjacent to the n-type layer 3 on the side of the principal surface 1a, a numeral 5 designates two band-shaped p-type impurity layers (p-type layer, third semiconductor layer) which are disposed in the n$^-$-type layer 2 in the principal surface 1b to be parallel to a pair of opposing edges of the semiconductor substrate 1 and to be apart from each other, numeral 6 similarly stands for two band-shaped second p-type layers having a high impurity concentration ($p_2^+$-type layer, third semiconductor layer) which are disposed in portions of two band-shaped p$^-$-type layers 5 along the longitudinal direction of the p-type layers 5, numeral 7 similarly indicates two band-shaped first n-type layers having a high impurity concentration ($n_1^+$-type layer, fourth semiconductor layer) which are disposed in portions of two band-shaped $p_2^+$-type layers 6 along the longitudinal direction of the $p_2^+$-type layers 6, numeral 8 denotes a second n-type layer having a high impurity concentration ($n_2^+$-type layer, fifth semiconductor layer) which is disposed in the n$^-$-type layer 2 in the principal surface 1b and which has both side edge portions to be respectively brought into contact with opposing side edge portions of two band-shaped p-type layers 5, numeral 9 designates a p-type layer having a low impurity concentration (p$^-$-type layer, sixth semiconductor layer) which is disposed between the n$^-$-type layer 2 and the $n_2^+$-type layer 8 and which has a plurality of notched portions 9a for partially providing a direct contact between the n$^-$-type layer 2 and the $n_2^+$-type layer 8, numeral 10 stands for two long insulated gate electrodes (G) which are mounted via an insulation layer 11 on the surface of the p-type layer 5 exposed between the $n_1^+$-type layer 7 and the $n_2^+$-type layer 8, numeral 12 indicates an insulation layer disposed to cover a portion of the exposed surface of the $n_1^+$-type layer 7, two insulated gate electrode (G), and the exposed surface of the $n_2^+$-type layer 8, numeral 13 denotes an anode electrode (A) disposed in a low-resistance contacting state on the $p_1^+$-type layer 4 on the principal surface 1a, and numeral 14 designates a cathode electrode (K) disposed to establish a low-resistance contact with the respective exposed surfaces of the $p_2^+$-type layer 6 and the $n_1^+$-type layer 7 and to cover the insulation layer 12.

Moreover, the n$^-$-type layer 2 and the n-type layer 3 form the first semiconductor layer, whereas the p-type layer 5 and the $p_2^+$-type layer 6 constitute the third semiconductor layer. The n$^-$-type layer 2, the n-type layer 3, the $p_1^+$-type layer 4, the p-type layer 5, the $p_2^+$-type layer 6, the $n_1^+$-type layer 7, the $n_2^+$-type layer 8, and p$^-$-type layer 9 configure as a whole the semiconductor substrate 1. In addition, the plural notched portions 9a disposed in the p$^-$-type layer 9 are of a band shape and extend in a direction substantially vertical to a pair of opposing edges of the substrate 1, namely, a direction substantially vertical to the longitudinal direction of the insulated gate electrodes (G) 10. Furthermore, the notches 9a are arranged with an equal interval therebetween along the longitudinal direction of the electrodes (G) 10. In this case, as for the portion where the p$^-$-type layer 9 is arranged, the p$^-$-type layer 9 intervenes between the n$^-$-type layer 2 and $n_2^+$-type layer 8. However, as for the portions where the notched portions 9a of the p$^-$-type layer 9 are arranged, the n$^-$-type layer 2 and $n_2^+$-type layer 8 are directly coupled with each other via the notched portions 9a. Moreover, two electrodes (G) 10 are electrically connected to each other at a position not shown in the diagram.

Figure 13:
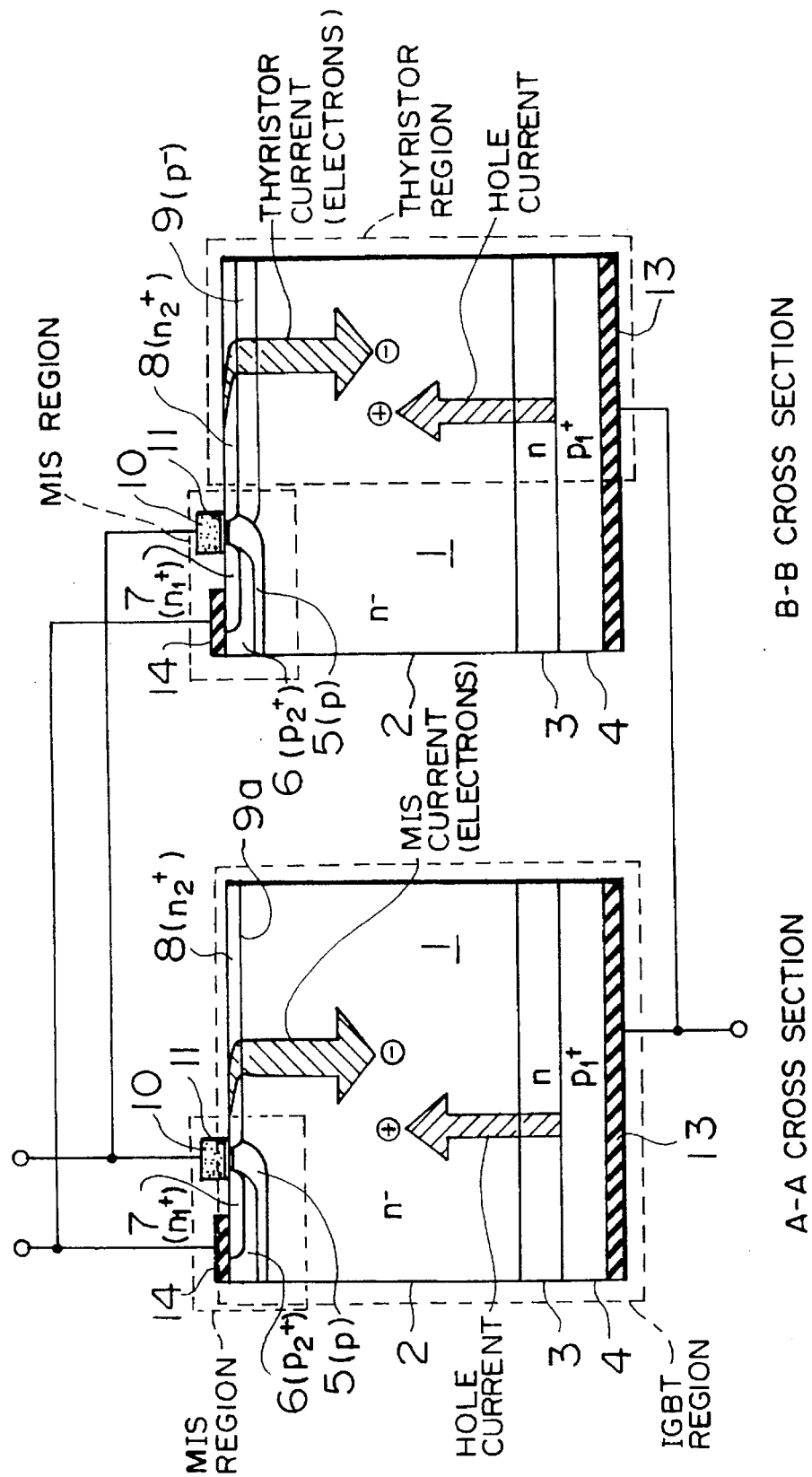
FIG. 13 is a schematic cross-sectional view of A—A and B—B line portions in the embodiment shown in FIG. 12B.
Figure 14:
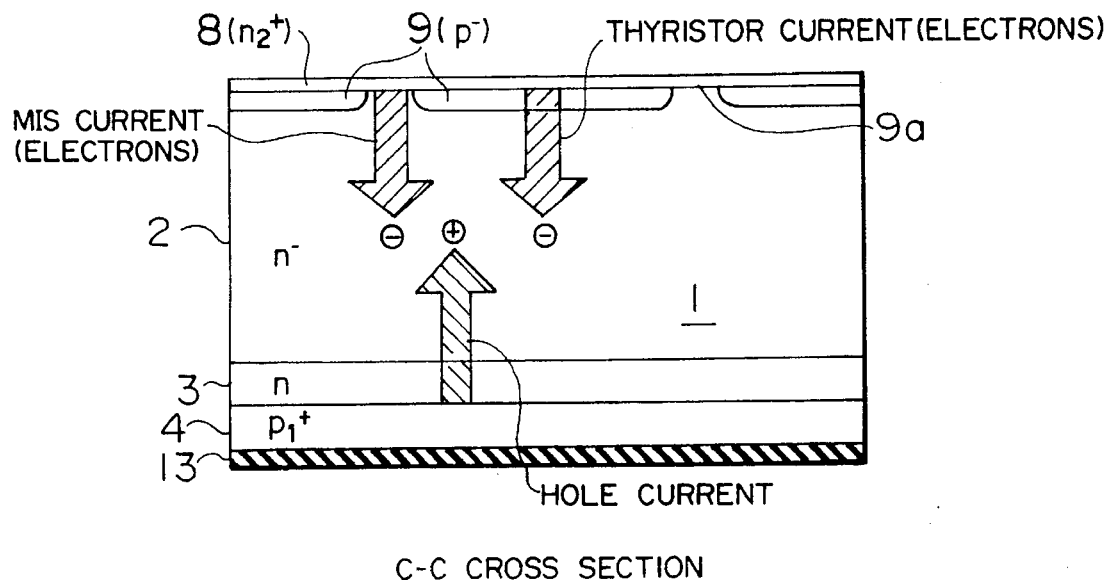
FIG. 14 is a schematic cross-sectional view of a C—C line portion in the embodiment shown in FIG. 12B.

Next, FIG. 13 is a lateral cross-sectional view of the A—A and B—B line portions shown in FIG. 12B, whereas FIG. 14 is a lateral cross-sectional view of the C—C portion shown in FIG. 12B.

In FIGS. 13 and 14, the same constituent elements as those of FIGS. 12A and 12B are assigned with the same reference numerals.

Furthermore, as shown in FIGS. 13 and 14, the p$^-$-type layer 9 intervenes between the n$^-$-type layer 2 and the $n_2^+$-type layer 8 excepting the portions where the notched portions 9a are arranged, thereby preventing the direct contact between the n$^-$-type layer 2 and the $n_2^+$-type layer 8. However, in the configuration of the where the notched portions 9a are fabricated, the n$^-$-type layer 2 is directly brought into contact with the $n_2^+$-type layer 8.

Figure 15:
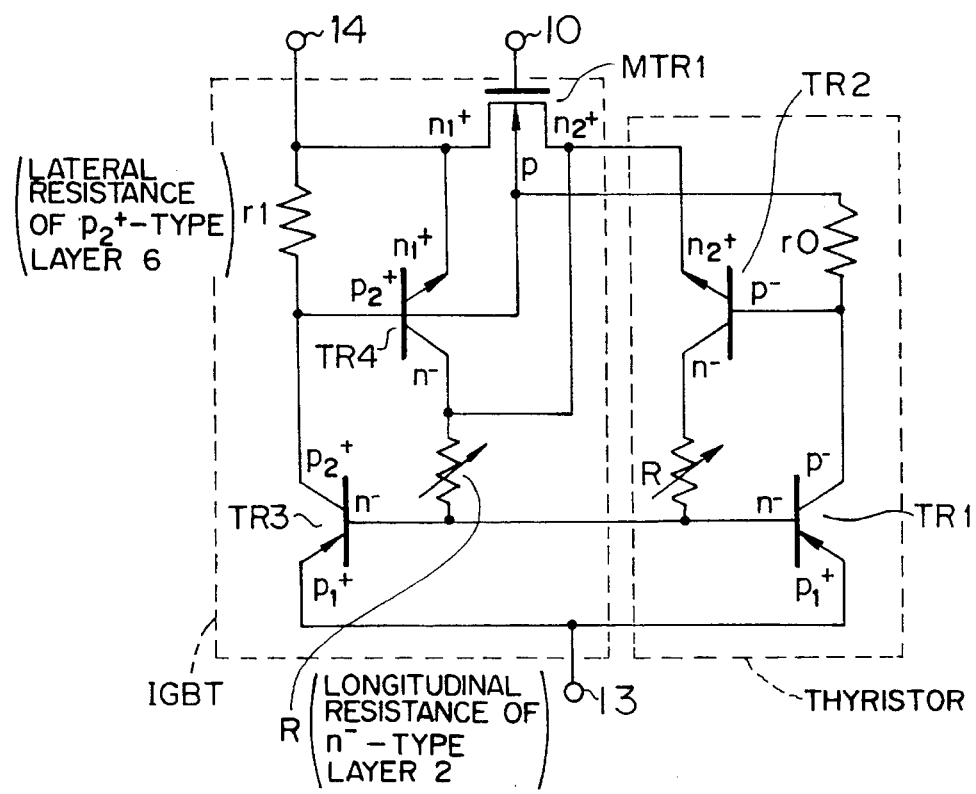
FIG. 15 is an equivalent circuit diagram of the complex semiconductor device shown in FIGS. 12A and 12B.

Subsequently, FIG. 15 is a circuit diagram showing an electrically equivalent circuit of the complex semiconductor device shown in FIGS. 12A and 12B.

In FIG. 15, TR1 indicates a first pnp transistor including the $p_1^+$-type layer 4, the n$^-$-type layer 2, and the p$^-$-type layer 9, TR2 denotes a first npn transistor including the n$^-$-type layer 2, the p$^-$-type layer 9, and the $n_2^+$-type layer 8, TR3 indicates a second pnp transistor including the $p_1^+$-type layer 4, the n$^-$-type layer 2, and the $p_2^+$-type layer 6, TR4 denotes a second npn transistor including the n$^-$-type layer 2, the $p_2^+$-type layer 6, and the $n_1^+$-type layer 7, MTR1 denotes an n-channel MISFET including the insulated gate electrode (G) 10, the $n_1^+$-type layer 7, the p-type layer 5, and the $n_2^+$-type layer 8, $r_0$ designates a lateral resistance of the p$^-$-type layer 9, $r_1$ stands for a lateral resistance of the $p_2^+$-type layer 6, and R indicates an internal resistance of the n$^-$-type layer 2. Of the other constituent elements, the same elements as those shown in FIGS. 12A and 12B are assigned with the same reference numerals.

Furthermore, the first pnp transistor (TR1) and the first npn transistor (TR2) configure a thyristor, whereas the n-channel MISFET (MTR1), the second pnp transistor (TR3), and the second npn transistor (TR4) form an IGBT.

In this way, the complex semiconductor device can be regarded as a complex semiconductor device in which, as shown in the equivalent circuit of FIG. 15, the IGBT and the thyristor are commonly connected to each other by the MISFET (MTR1) on the respective cathode sides.

Description will now be given of operation of the complex semiconductor device configured as above.

First, to turn the device on, a negative potential and a positive potential are applied respectively to the cathode electrode (K) 14 and the anode electrode (A) 13 such that the insulated gate electrode (G) 10 is applied with a positive potential higher than that of the cathode electrode (K) 14. In this situation, an inversion layer (channel) is formed in the surface portion of the p-type layer 5 below the insulated gate electrode (G) 10 and hence the $n_1^+$-type layer 7 and the $n_2^+$-type layer 8 are connected to each other via the inversion layer to turn the n-channel MISFET (MTR1) on. Consequently, electrons (MIS current) injected from the cathode electrode (K) 14 via the n-channel MISFET (MTR1) flow from the $n_2^+$-type layer 8 via the n$^-$-type layer 2 into the $p_1^+$-type layer 4 to set the first npn transistor (T1) to the on state so as to inject holes (hole current) from the $p_1^+$-type layer 4 into the n$^-$-type layer 2. Next, when the hole current flows via the p$^-$-type layer 9 and the n-channel MISFET (MTR1) into the p-type layer 5, the large lateral resistance $r_0$ of the p-type layer 5 increases the potential of the p$^-$-type layer 9, thereby developing a potential difference between the p$^-$-type layer 9 and the $n_2^+$-type layer 8. When the potential difference of the p$^-$-type layer 9 and the $n_2^+$-type layer 8 exceeds the diffusion potential (about 0.7 in silicon at the room temperature), the first npn transistor (TR2) is set to the on state and hence electrons are injected from the $n_2^+$-type layer 8 directly into the n$^-$-type layer 2. In consequence, the thyristor including the first pnp transistor (TR1) and the first npn transistor (TR2) ignites and the complex semiconductor device is set to the on state.

In this case, the lateral resistance $r_1$ of the $p_2^+$-type layer 6 is sufficiently low due to the high impurity concentration of the $p_2^+$-type layer 6 and hence the parasitic thyristor including the $n_1^+$-type layer 7, the $p_2^+$-type layer 6, the $n^-$-type layer 2, and the $p_1^+$-type layer 4 cannot be easily turned on. Moreover, the n-type layer 3 having a relatively high impurity concentration suppresses the hole injection efficiency in the first and second npn transistors (TR1) and (TR2). The layer 3 is inserted to prevent the latch-up of the parasitic thyristor and to reduce the loss caused by the tail current in the turn-off operation. Consequently, the impurity concentration and the thickness of the n-type layer 3 are to be appropriately set according to desired characteristics of the complex semiconductor device. In this regard, the means of suppressing the hole injection efficiency is not limited to the means setting the n-type layer 3, namely, there may be employed another means having the similar function. For example, the n-type layer 3 may be configured to be partially connected via a short circuit to the anode electrode (A) 13 or there may be disposed any known means in the junction portion between the $p_1^+$-type layer 4 and the $n^-$-type layer 2 to lower the lifetime of minority carriers.

On the other hand, to turn the device off, the potential applied to the insulated gate electrode (G) 10 is set to a value equal to or less than the potential applied to the cathode electrode (K) 14. In this situation, the inversion layer (channel) formed in the surface portion of the p-type layer 5 below the insulated gate electrode (G) 10 is extinguished and hence the injection of electrons flowing from the $n_1^+$-type layer 7 into $n^+$-type layer 8 is interrupted. In association therewith, the injection of electrons flowing from the $n_2^+$-type layer 8 into the $n^-$-type layer 2 is interrupted; consequently, the injection of holes from the $p_1^+$-type layer 4 into the $n^-$-type layer 2 is stopped and hence the complex semiconductor device is set to the off state.

Figure 16A:
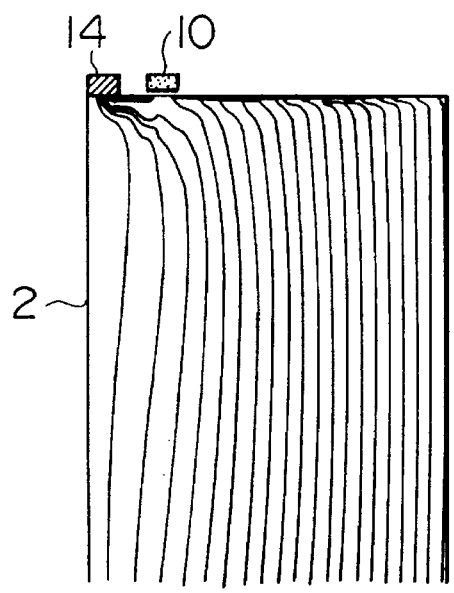
FIGS. 16A and 16B are diagrams showing lines of current flows respectively in a complex semiconductor device according to the present invention and a known complex semiconductor device.

Next, FIG. 16A is a diagram for explaining simulation results of lines of current flows in the cross section of the B—B line portion of the complex semiconductor device shown in FIG. 13 on the cathode side of the device in the on state.

In FIG. 16A, the same constituent elements as those of FIGS. 12A and 12B are assigned with the same reference numerals.

Figure 16B:
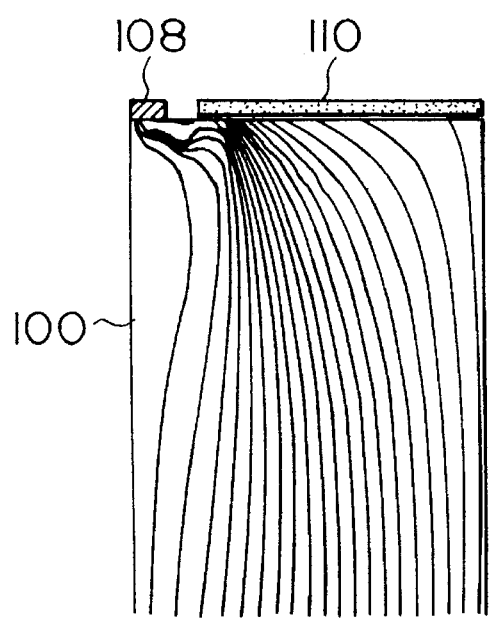

As shown in FIG. 16A, according to this device, as compared with the lines of current flows on the cathode side of the known IGBT in the on state (FIG. 16B), electrons supplied from the cathode electrode (K) 14 via the channel of the MISFET (MTR1) are fully extended to uniformly flow in the thyristor region. Consequently, the inter-terminal voltage in the on-state operation (resistance in the on-state operation) can be sufficiently reduced as compared with the known IGBT. In addition, in the device, the $p^-$-type layer 9 having a plurality of notched portions 9a are inserted between the $n_2^+$-type layer 8 and the $n^-$-type layer 2 to establish a partial contact between the $n_2^+$-type layer 8 and the $n^-$-type layer 2 in the thyristor region. Consequently, both of the MIS current and the thyristor current can be controlled by one MISFET (MTR1). Namely, the MIS current necessary to ignite the thyristor is required to pass only one channel resistance of the MISFET (MTR1). On the other hand, also the thyristor current passes only one channel resistance of the MISFET (MTR1). In consequence, with provision of only one small MISFET region (channel width), the thyristor can be easily ignited. Moreover, when the MISFET region (channel width) is minimized, it is possible to increase the area of the thyristor region in the overall device. This sufficiently reduces the inter-terminal voltage in the on-state operation (resistance in the on-state operation) and hence a high breakdown voltage and a large current can be easily attained for the device. Furthermore, as compared with the known semiconductor device, the area where the insulated gate electrode (G) 10 is disposed can be remarkably reduced. Consequently, only a small charge/discharge current is required for the gate, which also leads to an advantage that the switching operation speed is increased and the gate circuit size is minimized.

Additionally, the complex semiconductor device can be easily turned on and off by applying and removing a potential of a predetermined polarity to and from the insulated gate electrode (G) 10. Furthermore, thanks to adoption of the saturation characteristic of the n-channel MISFET (MTR1), there is obtained an aspect of a current limiting action even in the thyristor operation. In general, when producing the device, the structure shown in FIGS. 12A and 12B is used as a cell such that several hundred to several tens of thousand of cells are integrated in an identical semiconductor substrate to be connected to each other for operation in a parallel fashion. However, in the parallel operation, when each cell has the current limiting action, the current is not concentrated onto a particular cell or onto particular several cells so as to be uniformly loaded onto the respective cells. Consequently, it is advantageously possible to prevent destruction of the complex semiconductor device due to the current concentration.

Figure 17:
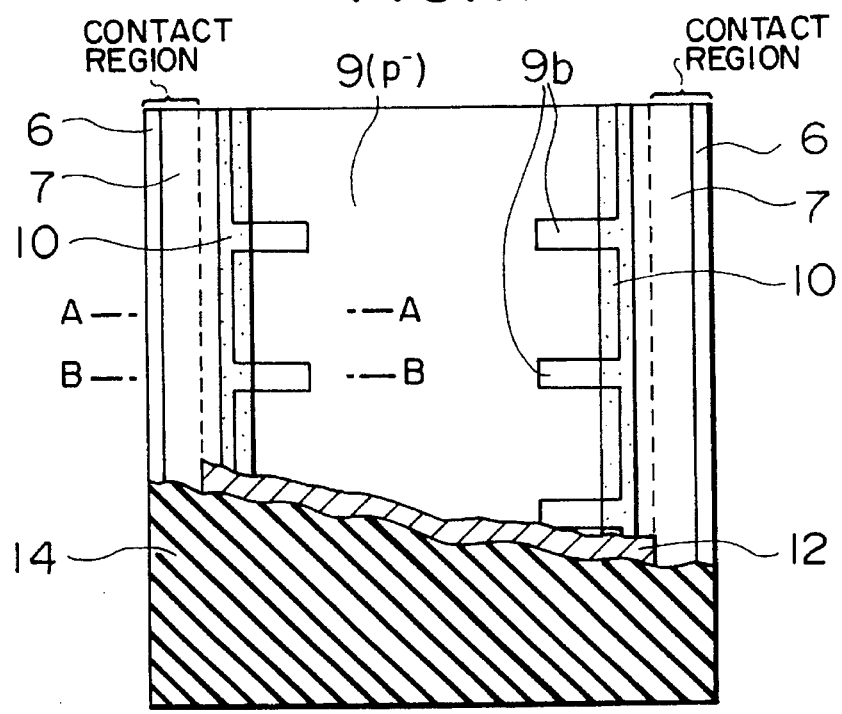
FIG. 17 is a schematic plan view on the side of an insulated gate electrode showing another variation of the complex semiconductor device shown in FIGS. 12A and 12B.
Figure 18:
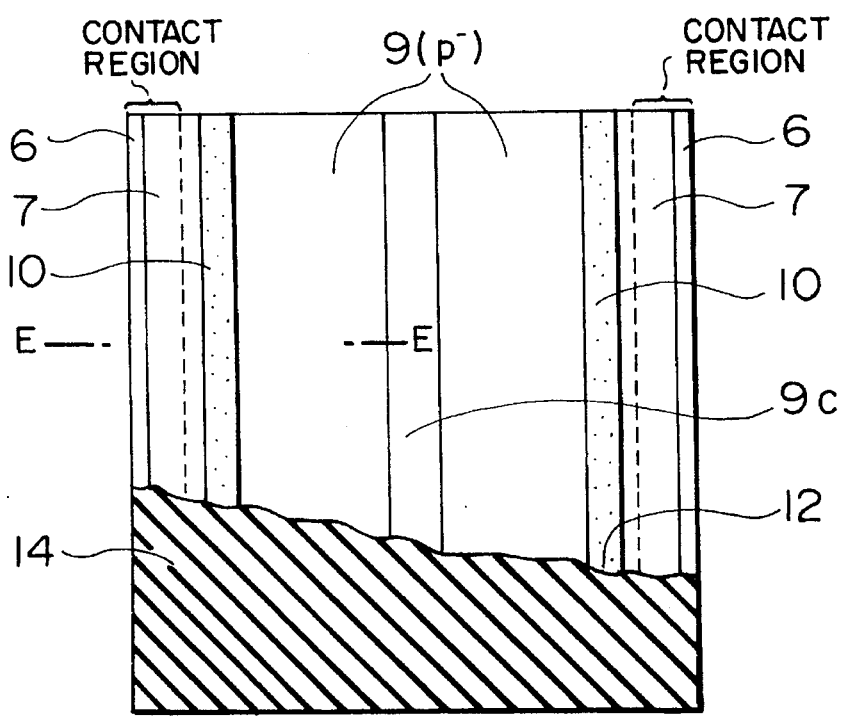
FIG. 18 is a schematic plan view showing a third configuration example formed by altering the configuration and the arranging positions of the notched portions of the p-type layer in the embodiment of FIGS. 12A and 12B.

Next, FIGS. 17 to 19 are schematic plan views showing second, third, and fourth examples in which the constitution and the arrangement positions of the notched portions of the $p^-$-type layer 9 are respectively altered in the complex semiconductor device shown in FIGS. 12A and 12B. FIGS. 20A to 20C are lateral cross-sectional views of A—A, B—B, C—C, D—D, and E—E line portions of FIGS. 17 to 19.

Numeral 9b indicates the notched portion of a second shape, numeral 9c in FIGS. 18 and 20C denotes the notched portion of a third shape, numeral 9d in FIGS. 19 and 20C indicates the notched portion of a fourth shape. Moreover, the same constituent elements as those shown in FIGS. 12A and 12B are assigned with the same reference numerals.

Furthermore, the notched portions 9b of the second shape are of a short band contour and extend in a direction substantially vertical to a pair of opposing edges of the semiconductor substrate 1, namely, to a direction substantially vertical to the longitudinal direction of the insulated gate electrode (G) 12. Moreover, the notched portions 9b extend up to an intermediate position of the $p^-$-type layer 9 in the direction of width thereof and are arranged with an equal interval therebetween in the longitudinal direction of the insulated gate electrode (G) 12. The notched portions 9c of the third shape are of a long band shape and extend in a direction parallel to a pair of opposing edges of the semiconductor substrate 1, namely, a direction parallel to the longitudinal direction of the insulated gate electrode (G) 12. Moreover, the notched portions 9c are arranged along an intermediate position of the $p^-$-type layer 9 in the direction of width thereof. Furthermore, the notched portions 9d of the fourth shape are of a circular contour and extend in a direction parallel to a pair of opposing edges of the semiconductor substrate 1, namely, along the longitudinal direction of the insulated gate electrode (G) 12. Moreover, the notched portions 9c are arranged with an equal interval therebetween at an intermediate position of the $p^-$-type layer 9 in the direction of width thereof.

In this case, as shown in FIGS. 17 to 19 and FIGS. 20A to 20C, the contacting portions of the notched portions 9b of the second shape with the $n_2^+$-type layer 8 and the $n^-$-type layer 2 are limited to the portions adjacent to the insulated gate electrode (G). Consequently, in the case employing the $p^-$-type layer 9 having such notched portions 9b, as compared with the case using the $p^-$-type layer 9 having the notched portions 9a shown in FIGS. 12A and 12B, it is possible to increase the area where the $p^-$-type layer 9 is arranged. Namely, the non-contact portions with the $n_2^+$-type layer 8 and the $n^-$-type layer 2 can be increased, thereby decreasing the inter-terminal voltage in the on-state operation (resistance in the on-state operation) of the complex semiconductor device. In addition, as shown in FIGS. 18 and 19 and FIGS. 20A to 20C, the contact portions of the notched portions 9c of the third shape with the $n_2^+$-type layer 8 and the $n^-$-type layer 2 are disposed in a portion apart from the insulated gate electrode (G) 10 and in a band-shaped portion parallel to the electrode (G) 10. In consequence, using the $p^-$-type layer 9 having such notched portions 9c, it is possible to increase the thyristor area adjacent to the n-channel MISFET (MTR1), thereby decreasing the inter-terminal voltage in the on-state operation (resistance in the on-state operation) of the complex semiconductor device. Furthermore, as shown in FIG. 19 and FIGS. 20A to 20C, the contact portions of the notched portions 9d of the fourth shape with the $n_2^+$-type layer 8 and the $n^-$-type layer 2 are separately disposed to be apart from each other in a portion apart from the insulated gate electrode (G) 10. Consequently, in a case adopting the $p^-$-type layer 9 having such notched portions 9d, like in the case employing the notched portions 9b of the second shape, it is possible to increase the area where the $p^-$-type layer 9 is arranged, namely, the non-contact portions with the $n_2^+$-type layer 8 and the $n^-$-type layer 2. Moreover, like in the case employing the notched portions 9c of the fourth shape, it is possible to increase the thyristor area adjacent to the n-channel MISFET (MTR1). In consequence, the inter-terminal voltage in the on-state operation (resistance in the on-state operation) of the complex semiconductor device can be decreased.

Incidentally, the shape of the notched portions disposed in the $p^-$-type layer 9 is not limited to the notched portions 9a shown in FIGS. 12A and 12B and the notched portions 9b, 9c and 9d of the second, third, and fourth shapes. Namely, there may be disposed notched portion having another shape. In this case, when the area of non-contact portions with the $n_2^+$-type layer 8 and the $n^-$-type layer 2 is decreased, the inter-terminal voltage in the on-state operation (resistance in the on-state operation) of the complex semiconductor device can be minimized, which is of course, favorable since it removes concerns about a decrease in the breakdown voltage.

In consequence, for the complex semiconductor device, it is desirable to adopt a structure in the plan view in which the total area of the notched portions of the $p^-$-type layer 9 is possibly reduced under the condition that the thyristor ignition and distinction characteristics are not deteriorated.

Figure 21:
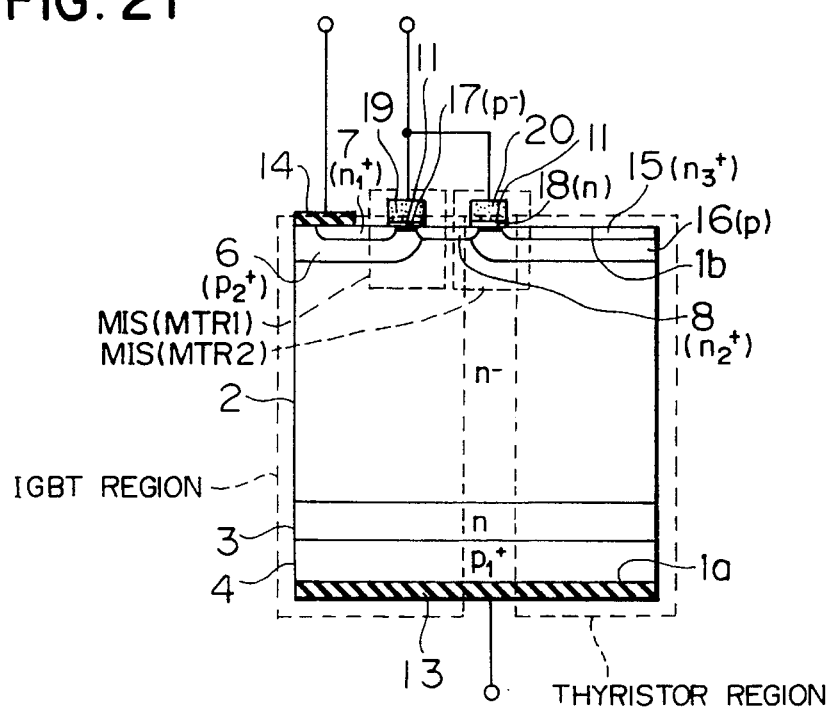
FIG. 21 is a schematic cross-sectional view showing the configuration of still another embodiment of the complex semiconductor device according to the present invention.

Next, FIG. 21 is a schematic cross-sectional view showing the constitution of further another embodiment of the complex semiconductor device according to the present invention.

In FIG. 21, numeral 15 indicates a third n-type layer of a high impurity concentration ($n_3^+$-type layer, seventh semiconductor layer) disposed on an $n^-$-type layer 2 of the principal surface 1b and arranged to be apart from the $n_2^+$-type layer 8, numeral 16 designates a p-type impurity layer (p-type layer, sixth semiconductor layer) arranged between the $n_2^+$-type layer 8 and the $n_3^+$-type layer 15 and between the $n^-$-type layer 2 and the $n_3^+$-type layer 15, numeral 17 denotes a second p-type layer of a low impurity concentration ($p_2^-$-type layer, eighth semiconductor layer) disposed on the surface of the $p_2^+$-type layer 6 exposed between the $n_1^+$-type layer 7 and the $n_2^+$-type layer 8, a numeral 18 stands for a fourth n-type impurity layer ($n_4$ layer, ninth semiconductor layer) disposed on the surface of the p-type layer 16 exposed between the $n_2^+$-type layer 8 and the $n_3^+$-type layer 15, numeral 19 indicates a first insulated gate electrode (G1) mounted via the insulation layer 11 on the surface of the $p_2^-$-type layer 17, and numeral 20 denotes a second insulated gate electrode (G2) mounted via the insulation layer 11 on the surface of the $n_4$ layer 18. Moreover, MTR1 designates a first MISFET including the first insulated gate electrode (G1) 19, the $n_1^+$-type layer 7, the $p_2^+$-type layer 6 including the $p_2^-$-type layer 17, and the $n_2^+$-type layer 8 and MTR2 denotes a second MISFET including the second insulated gate electrode (G2) 20, the $n_2^+$-type layer 8, the p-type layer 16 including the $n_4$ layer 18, and the $n_3^+$-type layer 15. Furthermore, the same constituent elements as those shown in FIGS. 12A and 12B are assigned with the same reference numerals.

In addition, the difference between the embodiment of FIG. 21 and that of FIGS. 12A and 12B resides only in that the embodiment of FIGS. 12A and 12B includes the $p^-$-type layer 9 having the notched portions 9a and the like between the $n^-$-type layer 2 and the $n_2^+$-type layer 8, whereas the $p^-$-type layer 9 of this kind is missing in the embodiment of FIG. 21. Moreover, the embodiment of FIGS. 12A and 12B does not include the second MISFET (MTR2), whereas the embodiment of FIG. 21 includes the second MISFET (MTR2). In the other points, the embodiment of FIG. 21 is substantially equal in the configuration to that of FIGS. 12A and 12B. In consequence, description will not be further given of the configuration of the embodiment of FIG. 21.

Figure 22:
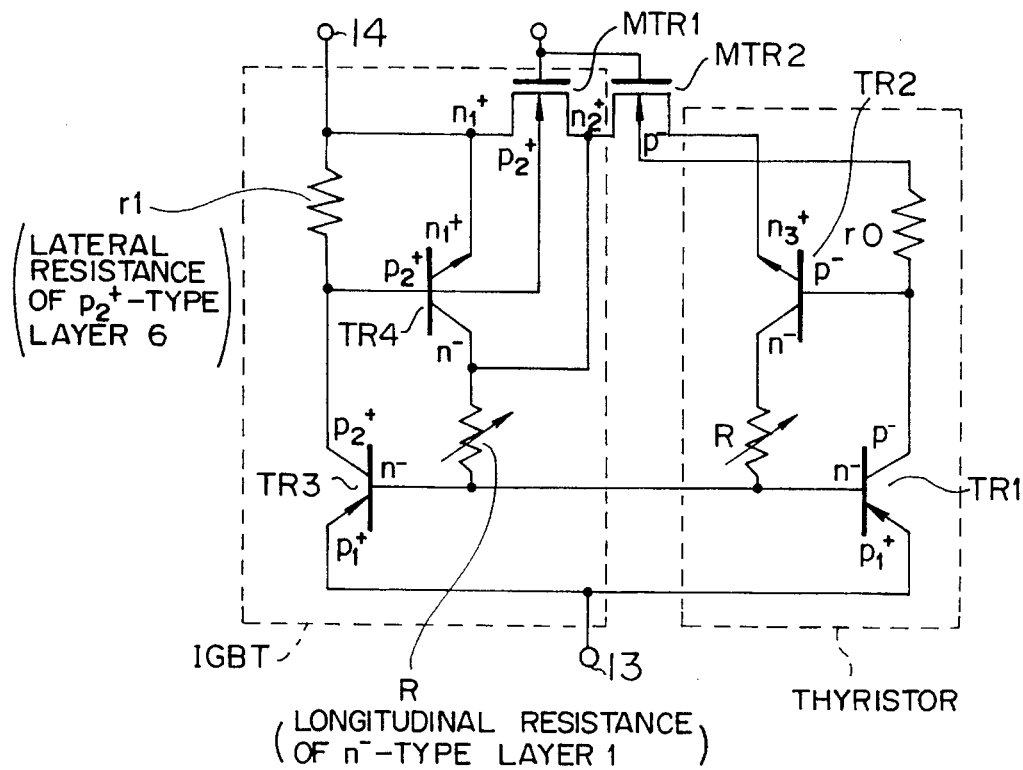
FIG. 22 is an equivalent circuit diagram of the embodiment of the complex semiconductor device shown in FIG. 21.

Furthermore, FIG. 22 is a circuit diagram showing an electrically equivalent circuit of the complex semiconductor device shown in FIG. 21.

In FIG. 22, TR1 indicates a first pnp transistor including the $p_1^+$-type layer 4, the $n^-$-type layer 2, and the p-type layer 16; TR2 denotes a first npn transistor including the $n^-$-type layer 2, the p-type layer 16, and the $n_3^+$-type layer 15; TR3 designates a second pnp transistor including the $p_1^+$-type layer 4, the $n^-$-type layer 2, and the $p_2^+$-type layer 6; TR4 stands for a second npn transistor including the $n^-$-type layer 2, the $p_2^+$-type layer 6, and the $n_1^+$-type layer 7; MTR1 indicates a first MISFET including the first insulated gate electrode (G1) 19, the $n_1^+$-type layer 7, the $p_2^+$-type layer 6 having the $p_2^-$-type layer 17, and the $n_2^+$-type layer 8; MTR2 indicates a second MISFET including the second insulated gate electrode (G2) 20, the $n_2^+$-type layer 8, the p-type layer 16 having the $n_4$ layer 18, and the $n_3^+$-type layer 15; $r_0$ denotes the lateral resistance of the p-type layer 16, and $r_1$ designates the lateral resistance of the $p_2^+$-type layer 6. Moreover, the same constituent elements as those shown in FIG. 21 are assigned with the same reference numerals.

In addition, the first pnp transistor (TR1) and the first npn transistor (TR2) construct a thyristor, whereas the the first MISFET (MIT2), the second pnp transistor (TR3), and the second npn transistor (TR4) form an IGBT.

Also in this embodiment, as shown in the equivalent circuit of FIG. 22, the IGBT and the thyristor are commonly coupled with each other by the first MISFET (MTR1) on their cathode sides, thereby configuring a complex semiconductor device.

Figure 23A:
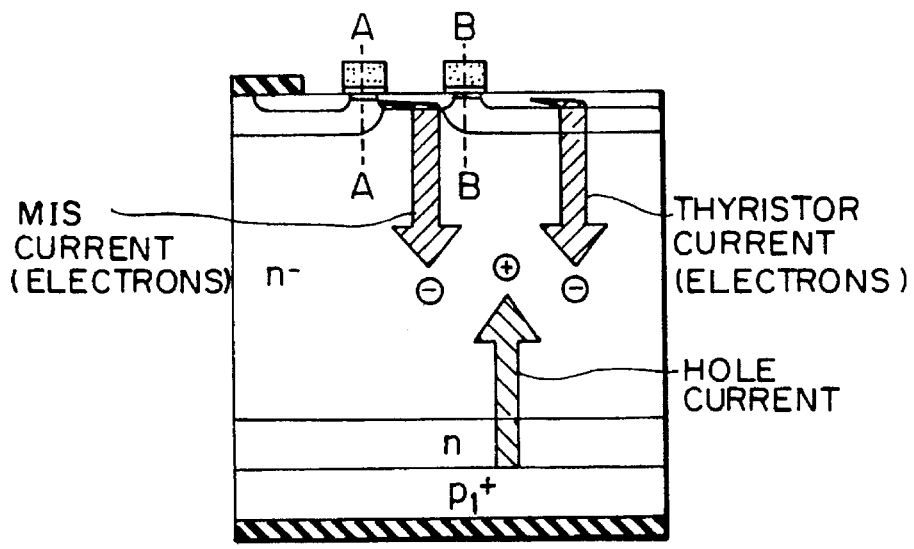
FIGS. 23A and 23B are explanatory diagrams for explaining carrier flows in the on state of the complex semiconductor device shown in FIG. 21 and impurity concentration distribution in A—A and B—B line portions thereof.
Figure 23B:
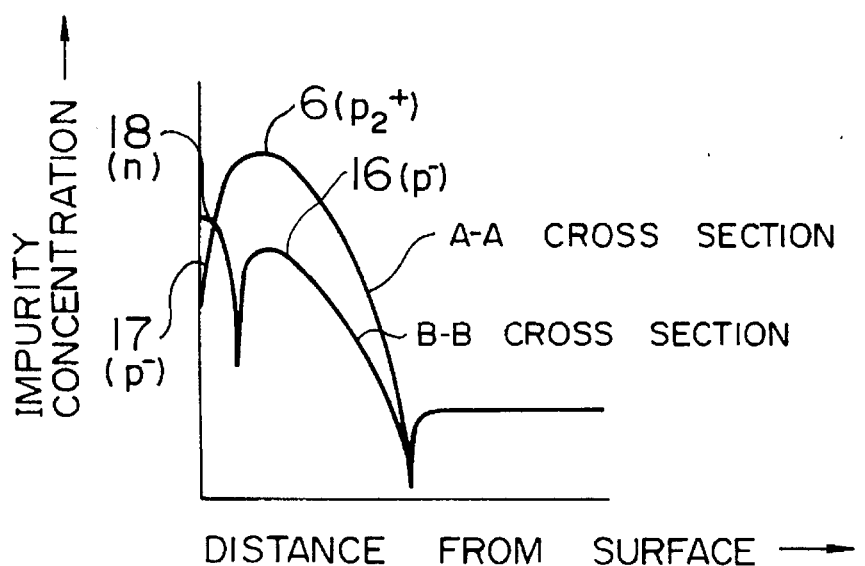

Next, FIGS. 23A and 23B are characteristic diagrams showing a state of the complex semiconductor device in the embodiment of FIG. 21. FIG. 23A shows flows of carriers in the device, whereas FIG. 23B shows the impurity concentration distributions in the A—A and B—B line cross-sectional portions.

As can be seen from FIG. 23B, in the the A—A line cross-sectional portion, there is developed a low impurity concentration due to existence of the $p_2^-$-type layer 17 disposed on the surface of the $p_2^+$-type layer 6, thereby adjusting the threshold voltage of the n-channel MISFET (MTR1) to a predetermined value. Moreover, in the B—B line cross-sectional portion, the n-channel MISFET (MTR2) is of the depletion or normally-on type due to the n-type layer 18 disposed on the surface of the p-type layer 16. In this case, the first and second insulated gate electrodes (G1, G2) 19 and 20 of these MISFETs (MTR1, MTR2) are electrically connected to each other at a position not shown in the diagram.

Next, description will be given of operation of the complex semiconductor device in the embodiment of FIG. 21 of the configuration above.

First, to turn the device on, a negative potential and a positive potential are applied respectively to the cathode electrode (K) 14 and the anode electrode (A) 13 such that each of the first and second insulated gate electrodes (G1, G2) 19 and 20 is applied with a positive potential higher than that of the cathode electrode (K). In this situation, an inversion layer (channel) is formed in the $p_2^-$-type layer 17 below the first insulated gate electrode (G1) 19 and the $n_1^+$-type layer 7 is connected via the channel to the $n_2^+$-type layer 8 so as to set the first MISFET (MTR1) to the on state. Consequently, electrons (MIS current) injected from the cathode electrode (K) 14 via the MISFET (MTR1) flows through the $n_2^+$-type layer 8 and the $n^-$-type layer 2 into the $p_1^+$-type layer 4 to set the first pnp transistor (TR1) to the on state, and hence holes (hole current) is injected from the $p_1^+$-type layer into the $n^-$-type layer 2. In this operation, when the hole current flows into the p-type layer 16, the potential of the p-type layer 16 is increased by the lateral resistance $r_0$ to develop a potential difference between the p-type layer 16 and the $n_3^+$-type layer 15. Moreover, when the potential difference exceeds the diffusion potential between the p-type layer 16 and the $n_3^+$-type layer 15 (about 0.7 V in silicon at the room temperature), the first npn transistor (TR2) is set to the on state. Consequently, the electrons flowing from the cathode electrode (K) 14 via the first MISFET (MTR1) and the second MISFET (MTR2), which has been similarly set to the on state, into the $n_3^+$-type layer 15 are injected from the $n_3^+$-type layer 15 directly into the $n^-$-type layer 2. In consequence, the thyristor including the first pnp transistor (TR1) and the second npn transistor (TR2) ignites and the complex semiconductor device is set to the on state.

In this case, the lateral resistance $r_1$ of the $p_2^+$-type layer 6 is sufficiently low due to the high impurity concentration of the $p_2^+$-type layer 6, and the parasitic thyristor including the $n_1^+$-type layer 7, the $p_2^+$-type layer 6, the $n^-$-type layer 2, and the $p_1^+$-type layer 4 cannot be easily turned on.

On the other hand, to turn the complex semiconductor device off, the potential of the first and second insulated gate electrodes (G1, G2) 19 and 20 are set to a value equal to or less than that of the cathode electrode (K). In this situation, the inversion layer (channel) is distinguished from the $P_2^-$-type layer 17 below the electrode (G1) 19 and hence the electrode injection from the $n_1^+$-type layer 7 into the $n_2^+$-type layer 8 is interrupted so as to turn the first MISFET (MTR1) off. As a result, since the electrons (MIS current) flowing from the $n_1^+$-type layer 7 into the $n^-$-type layer 2 as well as the electrons (MIS current) flowing from the $n_1^+$-type layer 7 via the $n_2^+$-type layer 8 and the $n_3^+$-type layer 15 into the $n^-$-type layer 2 are interrupted, the hole injection from the $p_1^+$-type layer 4 into the $n^-$-type layer 4 is also stopped and the complex semiconductor device is set to the off state.

In this case, although the second n-channel MISFET (MTR2) cannot be easily turned off because it is of the depletion type, there does not arise any problem since the complex semiconductor device is set to the off state when the first n-channel MISFET (MTR1) is turned off.

As above, in the complex semiconductor device of the embodiment of FIG. 21, the MIS current necessary to ignite the thyristor is required to pass only one channel resistance of the the first n-channel MISFET (MTR1). On the other hand, although the thyristor current is required to pass two channels of the first n-channel MISFET (MTR1) and the second n-channel MISFET (MTR2), since the second n-channel MISFET (MTR2) is of the depletion type, the channel resistance is quite small. Consequently, the thyristor current is substantially identical to a current which flows only through the channel resistance of the first n-channel MISFET (MTR1) and hence the inter-terminal voltage in the on-state operation (resistance in the on-state operation) can be sufficiently decreased. This enables a high breakdown voltage and a large current to be easily obtained for the complex semiconductor device.

In addition, also the complex semiconductor device in the embodiment of FIG. 21 can be easily turned on and off, like the embodiment of FIG. 12, by applying and removing a potential of a predetermined polarity to and from the first and second insulated gate electrodes (G1, G2) 19 and 20. Moreover, since there is employed the saturation characteristic of the first n-channel MISFET (MTR1), a current limiting action is provided even in the thyristor operation. In consequence, also in a case where the structure shown in FIG. 21 is adopted as a cell so as to integrate several hundred to several tens of thousand cells in an identical semiconductor substrate and to connect the cells to each other for a parallel operation, since each cell has the current limiting action, the current is not concentrated onto a particular one cell or several particular cells but is uniformly loaded onto the respective cells. Consequently, it is advantageously possible to prevent destruction of the complex semiconductor device due to the current concentration.

Furthermore, as compared with the embodiment of FIGS. 12A and 12B, the embodiment of FIG. 21 is advantageous in that the ignition characteristic and the reproducibility of the on-state voltage of the thyristor are superior and the device can be easily produced. That is, in the embodiment of FIGS. 12A and 12B, if the positions where the notched portions 9a to 9d are formed in the $p^-$-type layer 9, namely, the portions where the $n_2^+$-type layer 8 is directly brought into contact with the $n^-$-type layer 2 are shifted to the right or left in relation to the photomask alignment precision when the $p^-$-type layer 9 is formed, the size of each of the notched portions 9a to 9d (the portions of the direct connection) or the distance between each of the notched portions 9a to 9d (the portions of the direct connection) and the insulated gate electrode (G) 10 will be apart from the respective designed values. As a result, for each production of the complex semiconductor device, the MIS current to ignite the thyristor or the magnitude of the thyristor current varies. Consequently, the on voltage may disadvantageously vary for each production of the complex semiconductor device depending on cases. In contrast thereto, in the embodiment of FIG. 21, the contact portions between the n$^-$-type layer 2 and the n$_2{}^+$-type layer 8 can be manufactured according to the gate self-alignment technology. Consequently, the portions are limited to be between the first and second insulated gate electrodes (G1, G2) 19 and 20 regardless of the photomask aligning precision. In consequence, the contact areas and positions between the n$^-$-type layer 2 and the n$_2{}^+$-type layer 8 cannot alter for each production of the complex semiconductor device. As a result, the complex semiconductor devices can be attained with the fixed characteristics and quality.

Furthermore, in the embodiment of FIG. 21, the threshold voltage of the first n-channel MISFET (MTR1) is controlled by the impurity concentration of the p$_2{}^-$-type layer 17 disposed on the surface of the p$_2{}^+$-type layer 6 and independent of the impurity concentration of the p$_2{}^+$-type layer 6. Consequently, the impurity concentration of the p$_2{}^+$-type layer 6 can be set to a sufficiently high value so as to enclose the n$_1{}^+$-type layer 7. In addition, since the lateral resistance r$_1$ of the p$_2{}^+$-type layer 7 below the n$_1{}^+$-type layer 7 can be set to be smaller than that of the embodiment of FIGS. 12A and 12B, the parasitic thyristor including the n$_1{}^+$-type layer 7, the p$_2{}^+$-type layer 6, the n$^-$-type layer 2, and the p$_1{}^+$-type layer 4 cannot be easily turned on. This leads to an aspect that a much larger current can be obtained for the device.

In this case, the p$_2{}^-$-type layer 17 disposed on the surface of the p$_2{}^+$-type layer 6 and the n$_4$ layer 18 disposed on the surface of the p-type layer 16 can be simultaneously and easily formed by disposing the p$_2{}^+$-type layer 6 and the p-type layer 16 and achieving thereafter an ion injection of compensating n-type impurities into the surfaces thereof. This unnecessitates any special manufacturing technologies.

In this connection, means for conducting an ion injection of compensating n-type impurities into the respective surfaces of the p$_2{}^+$-type layer 6 and the p-type layer 16 is similarly applicable to the embodiment of FIGS. 12A and 12B. Namely, this is possible by providing a high impurity concentration for the p-type layer 5 shown in FIG. 12A or by replacing the p-type layer 5 with the p$_2{}^+$-type layer 6 and by conducting an ion injection of compensating n-type impurities into these surfaces, thereby disposing a p-type layer having a lower impurity concentration.

Figure 24A:
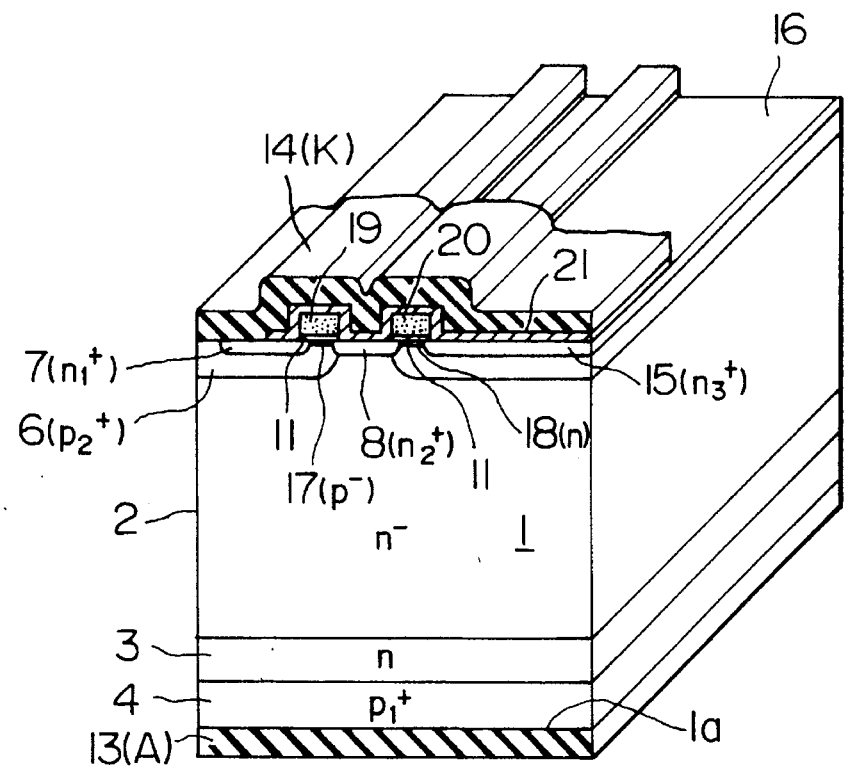
FIGS. 24A and 24B are a schematic perspective cross-sectional view and a specific plan view showing a configuration example obtained by modifying the configuration of a cathode electrode (K) in the embodiment of FIG. 21.
Figure 24B:
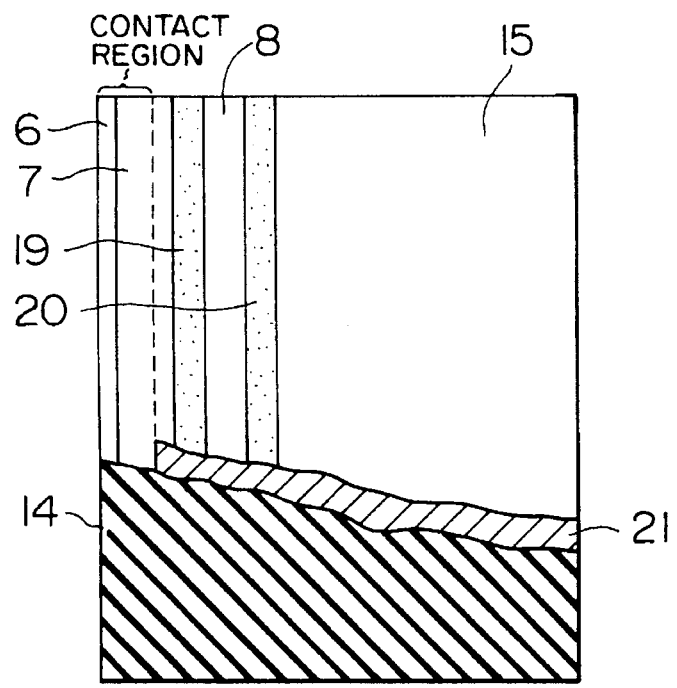

Subsequently, FIGS. 24A and 24B are configuration diagrams showing constitution examples of a complex semiconductor device analogous to the embodiment of FIG. 21. FIG. 24A is a schematic cross-sectional perspective view and FIG. 24B is a schematic plan view.

In FIGS. 24A and 24B, numeral 21 indicates an insulation layer, and the same constituent elements as those of FIG. 21 are assigned with the same reference numerals. In this connection, in FIGS. 24A and 24B, for easy understanding of the inner structure, the cathode electrode (K) and the insulation layer are partially removed.

Moreover, the difference between the construction example and the embodiment of FIG. 21 is as follows. In the construction example, in association with the configuration of arrangement of the cathode electrode (K) 14, there is used an ohmic contact to each of the n$_1{}^+$-type layer 7 and the p$_2{}^+$-type layer 6 and there is disposed an electric insulation by the insulation layer 21 from the first and second insulation gate electrodes (G1, G2) 19 and 20, the n$_2{}^+$-type layer 8, and the n$_3{}^+$-type layer 15 such that the insulation layer 21 covers the overall surface of the principal surface 1b. In contrast thereto, in the embodiment of FIG. 21, there is used only the ohmic contact to each of the n$_1{}^+$-type layer 7 and the p$_2{}^+$-type layer 6 and there is missing the extended portion in the portion other than the connecting portions. There dose not exist any other constitutional difference between the constitution example and the embodiment of FIG. 21.

According to the configuration example, the fine machining of the cathode electrode (K) 14 is unnecessitated. Moreover, the electric resistance between the cathode electrode (K) 14 and the n$_1{}^+$-type layer 7 and the p$_2{}^+$-type layer 6 and hence the heat dissipation efficiency from the semiconductor substrate 1 can be improved. Incidentally, also in the construction example, the first and second insulation gate electrodes (G1, G2) 19 and 20 are connected to each other at a position not shown in the diagram.

Figure 25:
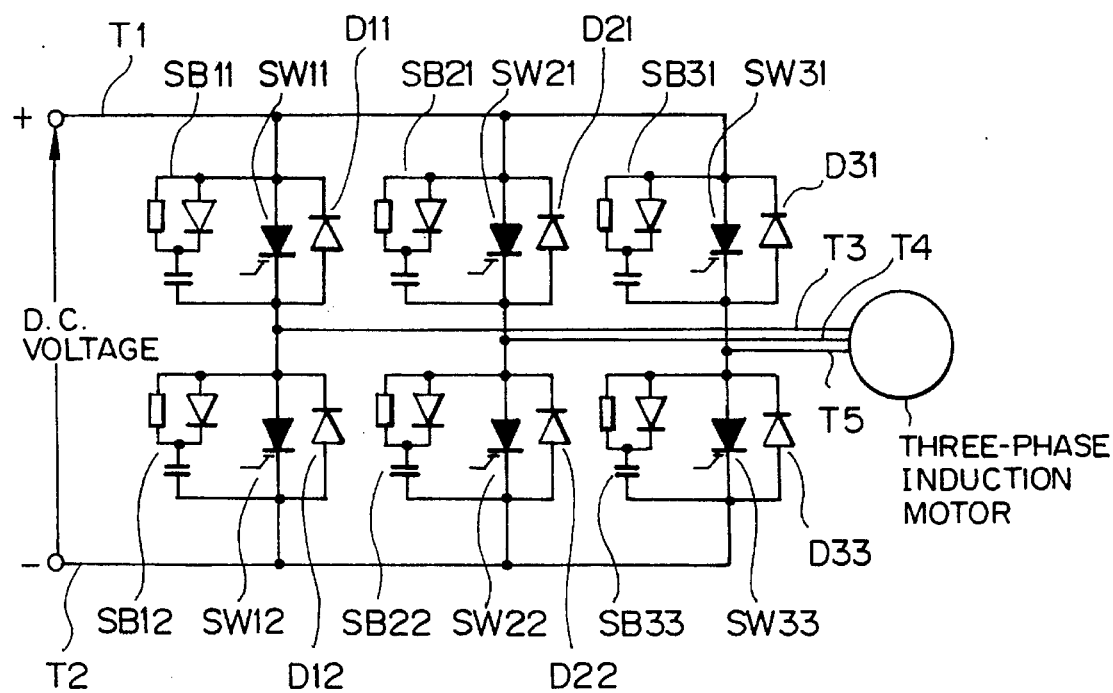
FIG. 25 is a schematic circuit diagram showing an example of the configuration of an inverter to drive a motor employing a complex semiconductor device according to the present invention.
Figure 26:
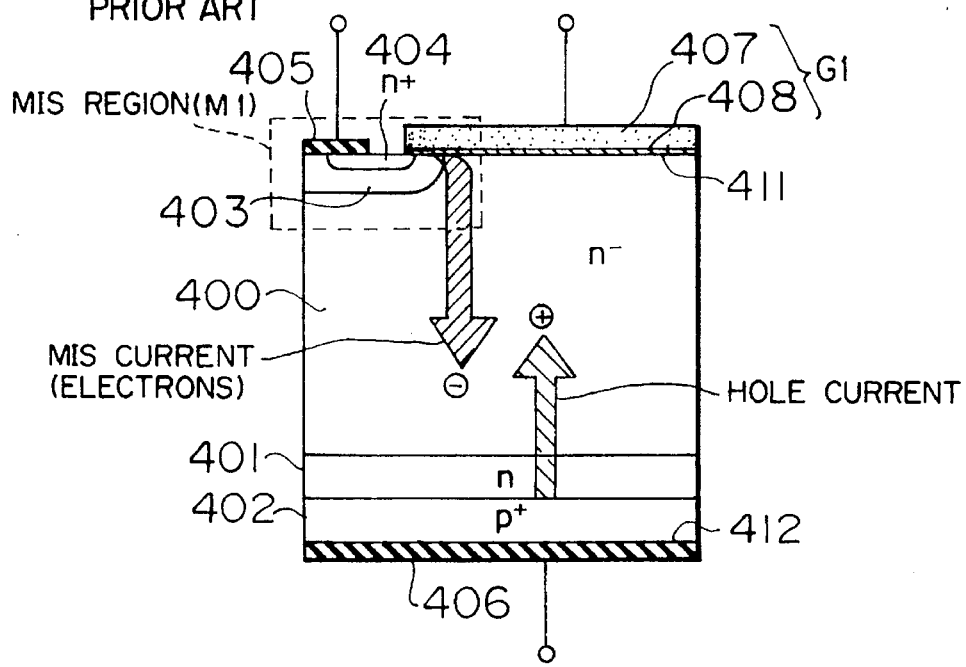
FIG. 26 is a schematic cross-sectional view of an IGBT presented as an example of technology prior to the present invention.
Figure 27:
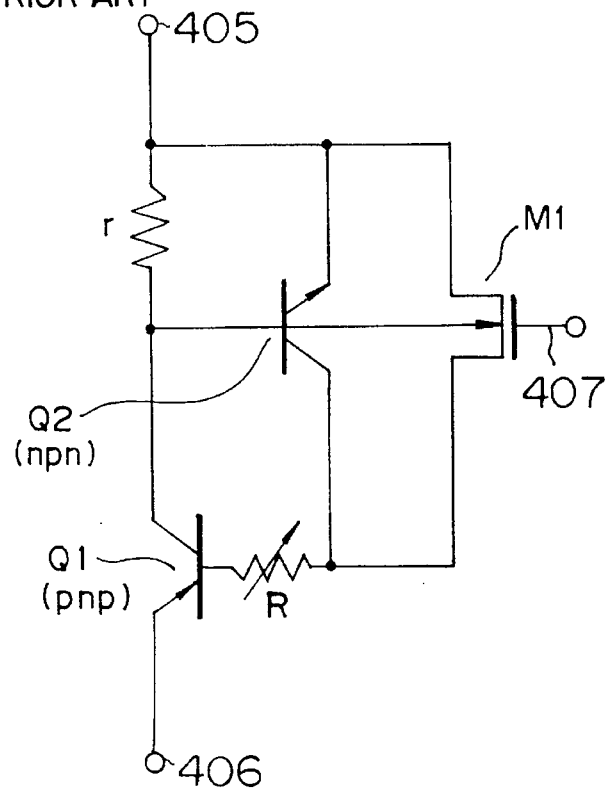
FIG. 27 is an equivalent circuit diagram of the IGBT shown in FIG. 26.

Next, FIG. 25 is an electric circuit diagram showing an example of a motor driving inverter system including the complex semiconductor device according to the present invention.

In FIG. 25, T$_1$ and T$_2$ indicate a pair of direct-current (dc) terminals connected to adc power source, T$_3$ to T$_5$ denote alternating-current (ac) terminals disposed as many as there are phases of an alternating current (ac) connected to a three-phase induction motor; SW$_{11}$, SW$_{12}$, SW$_{21}$, SW$_{22}$, SW$_{31}$, and SW$_{32}$ designate complex semiconductor devices of the present invention; D$_{11}$, D$_{12}$, D$_{21}$, D$_{22}$, D$_{31}$, and D$_{32}$ stand for flywheel diodes; SB$_{11}$, SB$_{12}$, SB$_{21}$, SB$_{22}$, SB$_{31}$, and SB$_{32}$ represent snubber circuits including a series connection of a parallel circuit of a diode and a resistor and a capacitor.

Moreover, the complex semiconductor devices of the present invention SW$_{11}$, SW$_{12}$, SW$_{21}$, SW$_{22}$, SW$_{31}$, and SW$_{32}$ form series connection circuits for three phases in which each of the circuits includes a series connection of two complex semiconductor devices selected therefrom. These series circuits are connected between the pair of dc terminals T$_1$ and T$_2$. In this case, the series connection points of the two complex semiconductor devices SW$_{11}$ and SW$_{12}$, SW$_{21}$ and SW$_{22}$, and SW$_{31}$ and SW$_{32}$ are respectively connected to the ac terminals T$_3$, T$_4$, and T$_5$. The flywheel diodes D$_{11}$, D$_{12}$, D$_{21}$, D$_{22}$, D$_{31}$, and D$_{32}$ are respectively linked in an inverse parallel connection with complex semiconductor devices SW$_{11}$, SW$_{12}$, SW$_{21}$, SW$_{22}$, SW$_{31}$, and SW$_{32}$; moreover, the snubber circuits are also respectively linked in an inverse parallel connection with the complex semiconductor devices SW$_{11}$, SW$_{12}$, SW$_{21}$, SW$_{22}$, SW$_{31}$, and SW$_{32}$, thereby configuring as a whole a motor driving inverter system.

Using the complex semiconductor devices SW$_{11}$, SW$_{12}$, SW$_{21}$, SW$_{22}$, SW$_{31}$, and SW$_{32}$ of the present invention in the motor driving inverter system, each of the devices SW$_{11}$, SW$_{12}$, SW$_{21}$, SW$_{22}$, SW$_{31}$, and SW$_{32}$ can be easily turned on and off by applying and removing a potential to the insulated gate electrode (G) thereof. This unnecessitates such operations of the known device of this kind as an operation in a GTO thyristor to flow and to draw a large amount of current into and from the gate electrode. This leads to an aspect of the present invention that the gate circuit can be remarkably simplified. In addition, since each of the devices SW$_{11}$, SW$_{12}$, SW$_{21}$, SW$_{22}$, SW$_{31}$, and SW$_{32}$ uses the saturation characteristic of the MISFET integrated therein, there can be developed a current limiting action even in the thyristor operation. Consequently, a large current can be controlled at a high speed by a low on-state voltage without destroying the complex semiconductor devices.

In consequence, as compared with the case where a known device of this kind, for example, a GTO thyristor is utilized in the motor driving inverter system, the inverter system above can be implemented as a small-sized and lightweight apparatus with a decreased loss, a low noise, and the like thanks to easy achievement of a high-frequency operation and easy control thereof. Moreover, also as compared with a case using, for example, the IGBT, there can be implemented a large-capacity and a low-loss inverter system developing a decreased on-state voltage.

As described above, according to the present invention, since the thyristor region is added to the IGBT in the best form, the electrons supplied from the cathode electrode via the MIS channel are sufficiently extended to flow in the thyristor region and hence the on-state voltage can be fully lowered without deteriorating the ignition characteristic. That is, the p-type base layer of the IGBT and the p-type base layer of the thyristor region are disposed to be separated from each other and the n-type emitter layer of the thyristor region is partially brought into contact with the n-type base layer so that the MIS current (electrons) and the thyristor current (electrons) flow only through one (series) MISFET, thereby achieving an easy ignition and attaining a low on-state voltage (a large current). In addition, for the p-type base layer of the IGBT and the p-type base layer of the thyristor region, there are partially disposed separated regions below the gate electrode so that the MIS current (electrons) and the thyristor current (electrons) flow at least partially through the channel resistance of one MISFET, thereby achieving an easy ignition and attaining a low on-state voltage (a large current). Consequently, there is obtained an effect that the semiconductor device is operated with a high breakdown voltage and a large current.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

I claim:

1. A complex semiconductor device, wherein:

an Insulated Gate Bipolar Transistor region and a thyristor region are arranged to be adjacent to each other in a semiconductor substrate; and a pair of first and second main electrodes are disposed on both principal surfaces of the semiconductor substrate, the Insulated Gate Bipolar Transistor region being directly connected to the pair of main electrodes, a first end region of the thyristor region on the anode side being directly connected to the first main electrode on the anode side; and a second end region of the thyristor region on the cathode side being connected to the second main electrode on the cathode side via an Metal Insulator Semiconductor Field Effect Transistor region existing in the Insulated Gate Bipolar Transistor region.

2. A complex semiconductor device comprising:

a semiconductor substrate including a first semiconductor layer of a first conductivity type, a second semiconductor layer of a second conductivity type being adjacent to the first semiconductor layer, a third semiconductor layer of the second conductivity type extending into the first semiconductor layer, a fourth semiconductor layer of the first conductivity type extending into the third semiconductor layer, a fifth semiconductor layer of the first conductivity type extending into the first semiconductor layer, being partially brought into contact with the third semiconductor layer and, being apart from the fourth semiconductor layer, and a sixth semiconductor layer of the second conductivity type being disposed between the first and fifth semiconductor layers, being apart from the third semiconductor layer;

a first main electrode being brought into contact with the second semiconductor layer;

a second main electrode being brought into contact with the third and fourth semiconductor layers; and a control electrode formed via an insulation layer on a surface of the third semiconductor layer exposed between the fourth and fifth semiconductor layers.

3. A complex semiconductor device according to claim 2, wherein:

the first semiconductor layer includes a first layer portion and a second layer portion having an impurity concentration higher than that of the first layer portion and being adjacent to the second semiconductor layer; and the third semiconductor layer includes a first layer portion being adjacent to the first layer portion of the first semiconductor layer and the fifth semiconductor layer and a second layer portion having an impurity concentration higher than that of the first layer portion of the third semiconductor layer, and being adjacent to the fourth semiconductor layer and being brought into contact with the second main electrode.

4. A complex semiconductor device comprising:

a semiconductor substrate including a first semiconductor layer of a first conductivity type, a second semiconductor layer of a second conductivity type being adjacent to the first semiconductor layer, a third semiconductor layer of the second conductivity type extending into the first semiconductor layer, a fourth semiconductor layer of the first conductivity type extending into the third semiconductor layer, a fifth semiconductor layer of the first conductivity type extending into a sixth semiconductor layer, the sixth semiconductor layer of the second conductivity type being disposed between the first and fifth semiconductor layers, and a seventh semiconductor layer of the first conductivity type extending into the sixth semiconductor layer, and being apart from the fifth semiconductor layer;

a first main electrode being brought into contact with the second semiconductor layer;

a second main electrode being brought into contact with the third, fourth, and seventh semiconductor layers;

a first control electrode formed via an insulation layer on a surface of the third, first, and sixth semiconductor layers exposed between the fourth and fifth semiconductor layers; and a second control electrode formed via an insulation layer on a surface of the sixth semiconductor layer exposed between the fifth and seventh semiconductor layers.

5. A complex semiconductor device according to claim 4, wherein the first control electrode has a width in a direction vertical to a longitudinal direction of the first control electrode, the width being larger than that of the second control electrode.

6. A complex semiconductor device comprising:

a semiconductor substrate including a first semiconductor layer of a first conductivity type, a second semiconductor layer of a second conductivity type being adjacent to the first semiconductor layer, a third semiconductor layer of the second conductivity type being disposed in the first semiconductor layer, being in a form of a plurality of bands parallel to an edge of the semiconductor substrate and apart from each other, a fourth semiconductor layer of the first conductivity type being disposed along a longitudinal direction of each of the plural bands of the third semiconductor layer, a fifth semiconductor layer of the first conductivity type being disposed in the first semiconductor layer and having both edge portions brought into contact respectively with two opposing side edge portions of the third semiconductor layer, and a sixth semiconductor layer of the second conductivity type being disposed between the first and fifth semiconductor layers and having at least one notched portion establishing a direct connection between the first and fifth semiconductor layers;

a first main electrode arranged on the second semiconductor layer;

a second main electrode arranged on each of the third and fourth semiconductor layers; and a control electrode disposed on the third semiconductor layer exposed between the fourth and fifth semiconductor layers.

7. A complex semiconductor device according to claim 6, wherein:

the first semiconductor layer includes a first semiconductor layer portion and a second semiconductor layer portion being adjacent to the second semiconductor layer and having an impurity concentration higher than that of the first semiconductor layer portion; and the third semiconductor layer includes a first semiconductor layer portion being brought into contact respectively with the first semiconductor layer portion of the first semiconductor layer and the fifth semiconductor layer and a second semiconductor layer portion being brought into contact with the second main electrode in a position apart from the control electrode.

8. A complex semiconductor device according to claim 6, wherein the notched portion of the sixth semiconductor layer has a band shape extending in a direction vertical to a longitudinal direction of the control electrode.

9. (Twice Amended) A complex semiconductor device according to claim 6, wherein the notched portion of the sixth semiconductor layer has a band shape extending in parallel with a longitudinal direction of the control electrode.

10. A complex semiconductor device according to claim 6, wherein the notched portion of the sixth semiconductor layer has substantially a circular shape.

11. A complex semiconductor device according to claim 6, wherein:

the semiconductor substrate includes an Insulated Gate Bipolar Transistor region and a thyristor region formed therein to be adjacent to each other;

the Insulated Gate Bipolar Transistor region is directly connected to the first and second main electrodes; and the thyristor region has a second end region on the cathode side being connected to the second main electrode via an Metal Insulator Semiconductor Field Effect Transistor region existing in the Insulated Gate Bipolar Transistor region and a first end region on the anode side being directly connected to the first main electrode.

12. A complex semiconductor device comprising:

a semiconductor substrate including a first semiconductor layer of a first conductivity type, a second semiconductor layer of a second conductivity type being adjacent to the first semiconductor layer, a third semiconductor layer of the second conductivity type, being disposed in the first semiconductor layer, a fourth semiconductor layer of the first conductivity type being disposed in the third semiconductor layer, a fifth semiconductor layer of the first conductivity type having a first side edge portion brought into contact with a side edge portion of the third semiconductor layer, a seventh semiconductor layer of the first conductivity type being disposed in a sixth semiconductor layer and being parallel to and apart from the fifth semiconductor layer, the sixth semiconductor layer of the second conductivity type having a first side edge portion brought into contact with a second side edge portion of the fifth semiconductor layer, an eighth semiconductor layer of the second conductivity type disposed in a surface of the third semiconductor layer between the fourth and fifth semiconductor layers, and a ninth semiconductor layer of the first conductivity type disposed in a surface of the sixth semiconductor layer between the fifth and seventh semiconductor layers;

a first main electrode arranged on the second semiconductor layer;

a second main electrode arranged on each of the third and fourth semiconductor layers;

a first control electrode disposed on the eighth semiconductor layer exposed between the fourth and fifth semiconductor layers; and a second control electrode disposed on the ninth semiconductor layer exposed between the fifth and seventh semiconductor layers.

13. A complex semiconductor device according to claim 12, wherein the fifth, sixth, seventh, and ninth semiconductor layers and the second control electrode form a portion configuring a first Metal Insulator Semiconductor Field Effect Transistor of a depletion type.

14. A complex semiconductor device according to claim 12, wherein:

the semiconductor substrate includes an Insulated Gate Bipolar Transistor region and a thyristor region formed therein to be adjacent to each other;

the Insulated Gate Bipolar Transistor region is directly connected to the first and second main electrodes; and the thyristor region has a second edge region on the cathode side connected to the second main electrode via a first Metal Insulator Semiconductor Field Effect Transistor region existing in the Insulated Gate Bipolar Transistor region and a second Metal Insulator Semiconductor Field Effect Transistor region of a depletion type and a first edge region on the anode side directly connected to the first main electrode.

* * * * *